US009240449B2

(12) United States Patent  
Chang

(10) Patent No.: US 9,240,449 B2  
(45) Date of Patent: Jan. 19, 2016

(54) ZERO-DIMENSIONAL ELECTRON DEVICES AND METHODS OF FABRICATING THE SAME

(71) Applicant: Yu-Chen Chang, New Taipei (TW)

(72) Inventor: Yu-Chen Chang, New Taipei (TW)

( * ) Notice: Subject to any disclaimer, the term of this patent is extended or adjusted under 35 U.S.C. 154(b) by 0 days.

(21) Appl. No.: 14/326,399

(22) Filed: Jul. 8, 2014

(65) Prior Publication Data

US 2015/0340437 A1    Nov. 26, 2015

Related U.S. Application Data

(60) Provisional application No. 62/002,997, filed on May 26, 2014.

(51) Int. Cl.
| | |
|---|---|
| H01L 29/06 | (2006.01) |
| H01L 33/04 | (2010.01) |
| H01L 33/00 | (2010.01) |
| H01L 33/12 | (2010.01) |
| H01L 33/30 | (2010.01) |
| H01L 29/20 | (2006.01) |
| B82Y 20/00 | (2011.01) |

(52) U.S. Cl.
CPC ............ *H01L 29/0665* (2013.01); *H01L 29/20* (2013.01); *H01L 33/0062* (2013.01); *H01L 33/04* (2013.01); *H01L 33/12* (2013.01); *H01L 33/305* (2013.01); *B82Y 20/00* (2013.01)

(58) Field of Classification Search
CPC ... H01L 29/0665; H01L 29/20; H01L 29/127; H01L 33/0062; H01L 33/305; H01L 33/12; H01L 33/04; B82Y 20/00
See application file for complete search history.

(56) References Cited

U.S. PATENT DOCUMENTS

| | | | | |
|---|---|---|---|---|
| 5,543,354 | A | * | 8/1996 | Richard et al. ................ 117/89 |
| 6,534,385 | B2 | * | 3/2003 | Park et al. .................... 438/459 |
| 7,160,822 | B2 | * | 1/2007 | Jones et al. .................. 438/478 |
| 7,318,651 | B2 | * | 1/2008 | Chua et al. .................... 362/11 |
| 8,633,504 | B2 | * | 1/2014 | Tsuyoshi ....................... 257/98 |
| 2002/0086494 | A1 | * | 7/2002 | Park et al. .................... 438/406 |
| 2005/0135079 | A1 | * | 6/2005 | Yin Chua et al. ............. 362/12 |
| 2005/0227386 | A1 | * | 10/2005 | Jones et al. .................... 438/22 |
| 2012/0112228 | A1 | * | 5/2012 | Tsuyoshi ....................... 257/98 |

OTHER PUBLICATIONS

Lu et al., "Temperature-dependent photoluminescence in light-emitting diodes", 2014, Scientific Reports, Vil. 4, pp. 1-6, Aug. 20, 2014.*
Sugawara et al., "Light emission spectra of columnar-shaped self-assembled InGaAs/GaAs quantum-dot lasers: Effect of homogeneous broadening of the optical gain on lasing characteristics", 1999, Applied Physics Letters, vol. 75, No. 11, pp. 1561-1563; Mar. 15, 1999.*
Mano, T., et al., GaAs/AlGaAs quantum dot laser fabricated on GaAs (311)A substrate by droplet epitaxy. Applied Physics Letters, 2008. 93(20): p. 203110-3, Nov . 2008.
Guimard, D., et al., Ground state lasing at 1.34 mu m from InAs/GaAs quantum dots grown by antimony-mediated metal organic chemical vapor deposition. Applied Physics Letters, 2007. 90(24): p. 241110-3, Jun. 20072006.

(Continued)

*Primary Examiner* — Nikolay Yushin

(57) ABSTRACT

A semiconductor device comprises a substrate and quantum dots, wherein a peak emission of the quantum dots has a FWHM of less than 20 meV when the semiconductor is measured at a temperature of 4 Kelvin.

26 Claims, 17 Drawing Sheets

(56) References Cited

OTHER PUBLICATIONS

Marti, A., et al., Production of Photocurrent due to Intermediate-to-Conduction-Band Transitions: A Demonstration of a Key Operating Principle of the Intermediate-Band Solar Cell. Physical Review Letters, 2006. 97(24): p. 247701, Dec. 2006.

Luque, A. and A. Marti, Increasing the Efficiency of Ideal Solar Cells by Photon Induced Transitions at Intermediate Levels. Physical Review Letters, 1997. 78(26): p. 5014-5017, Jun. 1997.

Park, I.-K., et al., Ultraviolet light-emitting diodes with self-assembled InGaN quantum dots. Applied Physics Letters, 2007. 90(11): p. 111116-3, Mar. 2007.

Li, J. and Wang, Shape Effects on Electronic States of Nanocrystals. Nano Letters, 2003. 3(10): p. 1357-1363, Nov. 2004.

Moison, J.M., et al., Self-organized growth of regular nanometer-scale InAs dots on GaAs. Applied Physics Letters, 1994. 64(2): p. 196-198, Jan. 1994.

Constantini, G., et al., Interplay between Thermodynamics and Kinetics in the Capping of InAs/GaAs(001) Quantum Dots. Physical Review Letters, 2006. 96(22): p. 226106, Jun. 2006.

Takehana, K., et al., Controlling the shape of InAs self-assembled quantum dots by thin GaAs capping layers. Journal of Crystal Growth, 2003. 251(1-4): p. 155-160, Dec. 2003.

N. Koguchi, K.I., Growth of GaAs Epitaxial Microcrystals on an S-Terminated GaAs Substrate by Successive Irradiation of Ga and As Molecular Beams Irradiation of Ga and As Molecular Beams. Japanese Journal of Applied Physics, 1993. 32(Part 1, No. 5A): p. 2052-2058, May 1993.

Mano, T., et al., Self-Assembly of Concentric Quantum Double Rings. Nano Letters, 2005. 5(3): p. 425-428, Mar. 2005.

Adorno, S., S. Bietti, and S. Sanguinetti, Annealing induced anisotropy in GaAs/AlGaAs quantum dots grown by droplet epitaxy. Journal of Crystal Growth, 2013. 378(0): p. 515-518, Nov. 2012.

Nemcsics, Á., et al., Composition of the "GaAs" quantum dot, grown by droplet epitaxy. Superlattices and Microstructures, 2010. 48(4): p. 351-357, Aug. 2010.

Sanguinetti, S., et al., Rapid thermal annealing effects on self-assembled quantum dot and quantum ring structures. Journal of Applied Physics, 2008. 104(11): p. 113519-5, Dec. 2008.

Lee, J.H., et al., Evolution between self-assembled single and double ring-like nanostructures. Nanotechnology, 2006. 17(15): p. 3973, Jul. 2006.

Tong, C.Z. and S.F. Yoon, Investigation of the fabrication mechanism of self-assembled GaAs quantum rings grown by droplet epitaxy. Nanotechnology, 2008. 19(36): p. 365604, Jul. 2008.

Somaschini, C., et al., Concentric Multiple Rings by Droplet Epitaxy: Fabrication and Study of the Morphological Anisotropy. Nanoscale Research Letters, 2010. 5(12): p. 1865-1867, Aug. 2010.

Wang, Z.M., et al., Nanoholes fabricated by self-assembled gallium nanodrill on GaAs(100). Applied Physics Letters, 2007. 90(11): p. 113120-3, Mar. 2007.

Li, A.Z., et al., Evolution of Holed Nanostructures on GaAs (001). Crystal Growth & Design, 2009. 9(6): p. 2941-2943, Dec. 2009.

M. Jo, T.M., & K. Sakoda, Unstrained GaAs Quantum Dashes Grown on GaAs(001) Substrates by Droplet Epitaxy. Applied Physics Express, 2010. 3(4), Apr. 2010.

Jo, M., et al., Effects of low-temperature capping on the optical properties of GaAs/AlGaAs quantum wells. Nanoscale Research Letters, 2011. 6(1): p. 76, Dec. 2011.

Jo, M., T. Mano, and K. Sakoda, Two-Step Formation of Gallium Droplets with High Controllability of Size and Density. Crystal Growth & Design, 2011. 11(10): p. 4647-4651, Aug. 2011.

Kukushkin, I.V., et al., Radiative recombination of two-dimensional electrons in acceptor δ-doped GaAs—AlxGa1—xAs single heterojunctions. Physical Review B, 1989. 40(11): p. 7788-7792, Oct. 1984.

Wang, S.M., et al., Growth of analog AlxGa1—xAs/GaAs parabolic quantum wells by molecular beam epitaxy. Applied Physics Letters, 1993. 62(1): p. 61, Dec. 1993.

Hegarty, J., L. Goldner, and M.D. Sturge, Localized and delocalized two-dimensional excitons in GaAs—AlGaAs multiple-quantum-well structures. Physical Review B, 1984. 30(12): p. 7346-7348, Dec. 1984

Kukushkin, I.V., et al., Luminescence experiments on acceptor δ-doped GaAs—AlGaAs single heterojunctions with optically tunable electron concentration. Surface Science, 1990. 229(1-3): p. 447-451, Dec. 1990.

Tsui, D.C., H.L. Stormer, and A.C. Gossard, Two-Dimensional Magnetotransport in the Extreme Quantum Limit. Physical Review Letters, 1982. 48(22): p. 1559-1562, May 1983.

Laughlin, R.B., Anomalous Quantum Hall Effect: An Incompressible Quantum Fluid with Fractionally Charged Excitations. Physical Review Letters, 1983. 50(18): p. 1395-1398, May 1983.

Willett, R.L., et al., Quantitative experimental test for the theoretical gap energies in the fractional quantum Hall effect. Physical Review B, 1988. 37(14): p. 8476-8479, May 1988.

Wigner, E., On the Interaction of Electrons in Metals. Physical Review, 1934. 46(11): p. 1002-1011, Dec. 1934.

Andrei, E.Y., et al., Observation of a Magnetically Induced Wigner Solid. Physical Review Letters, 1988. 60(26): p. 2765-2768, Jun. 1998.

N. Koguchi, K.I., Growth of GaAs Epitaxial Microcrystals on an S-Terminated GaAs Substrate by Successive Inrradiation of Ga and As Molecular Beams Irradiation of Ga and As Molecular Beams. Japanese Journal of Applied Physics, 1993. 32(Part 1, No. 5A): p. 2052-2058, May 1993.

Kukushkin, I.V. and V.B. Timofeev, Magneto-optics of strongly correlated two-dimensional electrons in single heterojunctions. Advances in Physics, 1996. 45(3): p. 147-245, Dec. 1996.

Offermans, P., et al., Atomic-scale structure and photoluminescence of InAs quantum dots in GaAs and AlAs. Physical Review B, 2005. 72(16): p. 165332, Oct. 2005.

Vurgaftman, I., J.R. Meyer, and L.R. Ram-Mohan, Band parameters for III-V compound semiconductors and their alloys. Journal of Applied Physics, 2001. 89(11): p. 5815-5875, Jun. 2001.

Fushimi, H. and K. Wada, Carbon-related defects in carbon-doped GaAs by high-temperature annealing. Journal of Applied Physics, 1997. 82(3): p. 1208-1213, Apr. 1997.

Bietti, S., et al., Effects of As pressure on the quality of GaAs/AlGaAs quantum dots grown on silicon by droplet epitaxy. Journal of Crystal Growth, 2013(0), Apr. 2013.

Atkinson, P., E. Zallo and O.G. Schmidt, Independent wavelength and density control of uniform GaAs/AlGaAs quantum dots grown by infilling self-assembled nanoholes. Journal of Applied Physics, 2012. 112(5), Sep. 2012.

Heyn, C., et al., Mechanism and applications of local droplet etching. Journal of Crystal Growth, 2011. 323(1): p. 263-266, Oct. 2011

Somaschini, C., et al., Coupled quantum dot-ring structures by droplet epitaxy. Nanotechnology, 2011. 22(18): p. 185602, Mar. 2011.

Miller, R.C., et al., Extrinsic photoluminescence from GaAs quantum wells. Physical Review B, 1982. 25(6): p. 3871-3877. Mar. 1982.

K. Watanabe, N. K., & Y. Gotoh, , Fabrication of GaAs Quantum Dots by Modified Droplet Epitaxy. Japanese Journal of Applied Physics, 2000. 39(Part 2, No. 2A): p. L79-L81. Feb. 1, 2000.

S. Sanguinetti et al, Modified Droplet Epitaxy GaAs/AlGaAs Quantum Dots Grown on a Variable Thickness Wetting Layer, Journal of Crystal Growth 253, p. 71-76 (2003), Dec. 2003.

M. Grundmann et al., InAs/GaAs Pyramidal Quantum Dots: Strain Distribution, Optical Phonons, and Electronic Structure, Phys. Rev. B 52, 16, p. 969-981 (1995), Oct. 15, 1995.

* cited by examiner

ZERO-DIMENSIONAL ELECTRON DEVICES AND METHODS OF FABRICATING THE SAME

CROSS-REFERENCE TO RELATED APPLICATIONS

This application claims the benefit of U.S. Provisional Application No. 62/002,997, filed May 26, 2014.

TECHNICAL FIELD

The present invention relates generally to zero-dimensional electron devices and methods of fabricating the same. It also relates to highly uniform quantum dots and methods of growing quantum dots on a semiconductor device.

BACKGROUND

A quantum dot (QD) is a tiny speck of matter so small that it is effectively concentrated into a single point (i.e., zero dimensional). As a result, the particles inside it that carry electricity (electrons and holes) are trapped or constrained and have well-defined energy levels according to the laws of quantum theory. Typically, QDs are crystals a few nanometers wide, so they are a few dozen atoms across and contain anything from perhaps a hundred to a few thousand atoms. QDs are made from a semiconductor such as silicon and although they're crystals, they behave more like individual atoms.

QDs may be controlled precisely to have wide applications in the real world. As a general background, if an atom is given energy, it can be excited (i.e., boost an electron inside it to a higher energy level). When the electron returns to a lower level, the atom emits a photon of light with the same energy that the atom originally absorbed. The color (i.e., wavelength and frequency) of light an atom emits depends on what the atom is because of the way their energy levels are arranged. Generally speaking, different atoms give out different colors of light. This is because the energy levels in atoms have set values (i.e., they are quantized).

QDs do the same, as they also have quantized energy levels. However, QDs made from the same material will give out different colors of light depending on how big they are. A small QD has a bigger band gap, which, roughly speaking, is the minimum energy it takes to free electrons so they'll carry electricity through a material, so it takes more energy to excite it. Because the frequency of emitted light is proportional to the energy, smaller QDs with higher energy produce higher frequencies and lower wavelengths. Larger QDs have more spaced energy levels and thus produce lower frequencies and higher wavelengths.

As a result, the biggest QDs produce the highest wavelengths (and shortest frequencies), while the smallest QDs make shorter wavelengths (and higher frequencies). This generally means that big QDs produce red light and small QDs produce blue, while medium-sized QDs produce green light (and other colors too).

In recent time, the fabrication of self-assembled QDs has been intensively investigated because of their potential for novel optoelectronic device applications, such as lasers, solar cell and light-emitting diodes. Indeed, the optoelectronic properties of QDs are strongly associated with their physical properties such as size, composition, strain and shape which determine the confinement potential of the electrons and holes. Thus, the growth mechanisms for fabricating active quantum nanostructures are becoming important.

Among various growth techniques, the most common approach is Stranski-Krastanov (SK) growth mode that is based on self-assembled mechanism and typically used in lattice mismatched systems, such as InAs/GaAs systems. In the SK growth, a thin film of semiconductor is grown on a semiconductor substrate, generating a lattice mismatch at the interface of the two materials. During the epitaxial growth, the interlayer mismatch strain is partially relaxed and three-dimensional structures are then formed. However, the morphology and composition of QDs will be significantly changed during the deposition of a capping layer, which make it difficult to achieve the designed properties. Furthermore, this technique was not available in lattice-matched system such as GaAs/AlGaAs systems due to the absence of strain.

An alternative and promising technique for fabricating strain-free GaAs/AlGaAs QDs is droplet epitaxy (DE) growth mode which is first demonstrated by Koguchi and Ishige in 1993. In comparison with SK technique, DE technique can be used in both lattice-mismatched and lattice-matched systems and thus have high design flexibility. In the case of GaAs QDs, numerous metallic Ga droplets are first formed on the substrate in the absence of $As_4$ flux. Droplets are subsequently crystallized through exposure to an $As_4$ flux for the formation of GaAs QDs. Ga droplets are usually formed at low temperature (~300° C.) in order to maintain their original morphology. However, such low temperature often causes degradation of crystalline and optical qualities during the deposition of AlGaAs capping layer. Moreover, this low-temperature surrounding also strongly influences the formation of GaAs materials while incorporating Carbon dopants.

It has been demonstrated that the intensity of $As_4$ flux and crystallization temperature will determine the final morphology. For example, generally GaAs QDs are not Carbon-doped and are formed at low temperature (around 100° C.-200° C.) with an $As_4$ fluxes of $10^{-4}$-$10^{-5}$ Torr at the crystallization step. Single, double or multiple quantum rings (QRs) are generated under the $As_4$ flux of $10^{-6}$-$10^{-7}$ Torr at the growth temperature between 200° C.-450° C. at the crystallization step. The holed nanostructures are grown at higher crystallization temperature (T=450° C.-620° C.).

A series of previous studies have been demonstrated that the experimental conditions can determine the final structures. However, some drawbacks are still existed. In case of GaAs QDs formation, Ga droplets are formed at low temperature in order to maintain their original morphology. Such low temperature growth process often causes degradation of crystalline and optical qualities during the deposition of AlGaAs capping layer. Therefore, more works are necessary for the fabrication of high-quality QDs.

In addition, recombination between confined electrons and photo-excited holes bound to acceptor impurities has a number of advantages for the study of novel physical phenomena in semiconductor nanostructures. Since bound-hole energy is very well defined, photoluminescence (PL) is a direct measurement of the energy spectrum of the electronic states, and localization of the hole relaxes k-conservation rules such that the entire electronic density of states can be investigated. This technique was used very successfully to probe the physics of two-dimensional (2D) electron system, leading to optical investigation of Landau levels, Shubnikov-de Haas oscillations, the fractional quantum Hall effect and Wigner crystallization. However, it is believed that there is no equivalent work involving zero-dimensional (quantum-dot) structures.

Therefore, there is a need for a new zero-dimensional electron device consists of highly-uniform Carbon-doped GaAs and/or a highly-uniform GaAs and the methods of making the same. This new zero-dimensional electron device has broad applications in the semiconductor field including QD lasers, solar cell, light-emitting diodes, single photon sources for quantum cryptography, quantum bits, and quantum logical elements.

SUMMARY

Consistent with the present disclosure, semiconductor devices disclosed herein comprise a substrate and quantum dots, wherein a peak emission of the quantum dots has a FWHM of less than 20 meV when the semiconductor is measured at a temperature of 4 Kelvin.

Also consistent with the present disclosure, semiconductor devices disclosed herein comprise a substrate and quantum dots, wherein the photoluminescence spectrum of the quantum dots has more than two peaks in the red light range.

Also consistent with the present disclosure, methods of growing quantum dots on semiconductor devices are disclosed herein. The methods comprises (a) providing a substrate; (b) supplying a group V material; (c) growing a group III-V material buffer layer above the substrate at a growth temperature above 500° C.; (d) lowering the growth temperature to about 500° C.; (e) stopping the supply of the group V material; (f) growing group III material droplets; (g) lowering the growth temperature to less than about 400° C.; (h) growing more group III material droplets; and (i) increasing the growth temperature to up to about 450° C.

Further consistent with the present disclosure, methods of growing quantum dots on semiconductor devices are disclosed herein. The methods comprises (a) providing a substrate; (b) supplying a group V material; (c) growing a group III-V material buffer layer above the substrate at a growth temperature above 500° C.; (d) stopping the supply of the group V material; (e) supplying a group II or group IV material; (f) lowering the growth temperature to less than about 200° C.; (g) stopping the supply of the group II or group IV material; and (h) growing group III material droplets with the group II or group IV material.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments.

DETAILED DESCRIPTION

Reference will now be made in detail to exemplary embodiments consistent with the present invention, examples of which are illustrated in the accompanying drawings. Wherever possible, the same reference numbers will be used throughout the drawings to refer to the same or like parts. While the description includes exemplary embodiments, other embodiments are possible, and changes may be made to the embodiments described without departing from the spirit and scope of the invention. The following detailed description does not limit the invention. Instead, the scope of the invention is defined by the appended claims and their equivalents.

Consistent with an embodiment of the invention, a semiconductor device is disclosed, comprising a substrate and QDs, wherein a peak emission of the QDs has a FWHM of less than 20 meV when the semiconductor is measured at a temperature of 4 Kelvin (K). The semiconductor device may further comprise a buffer layer wherein the buffer layer comprises a group III material and a group V material, including a group III-V material, and the QDs comprise a group III material and a group V material. For example, the buffer layer may be a GaAs buffer layer and the QDs comprise GaAs such as highly-uniform GaAs/AlGaAs QDs.

Figure 1:
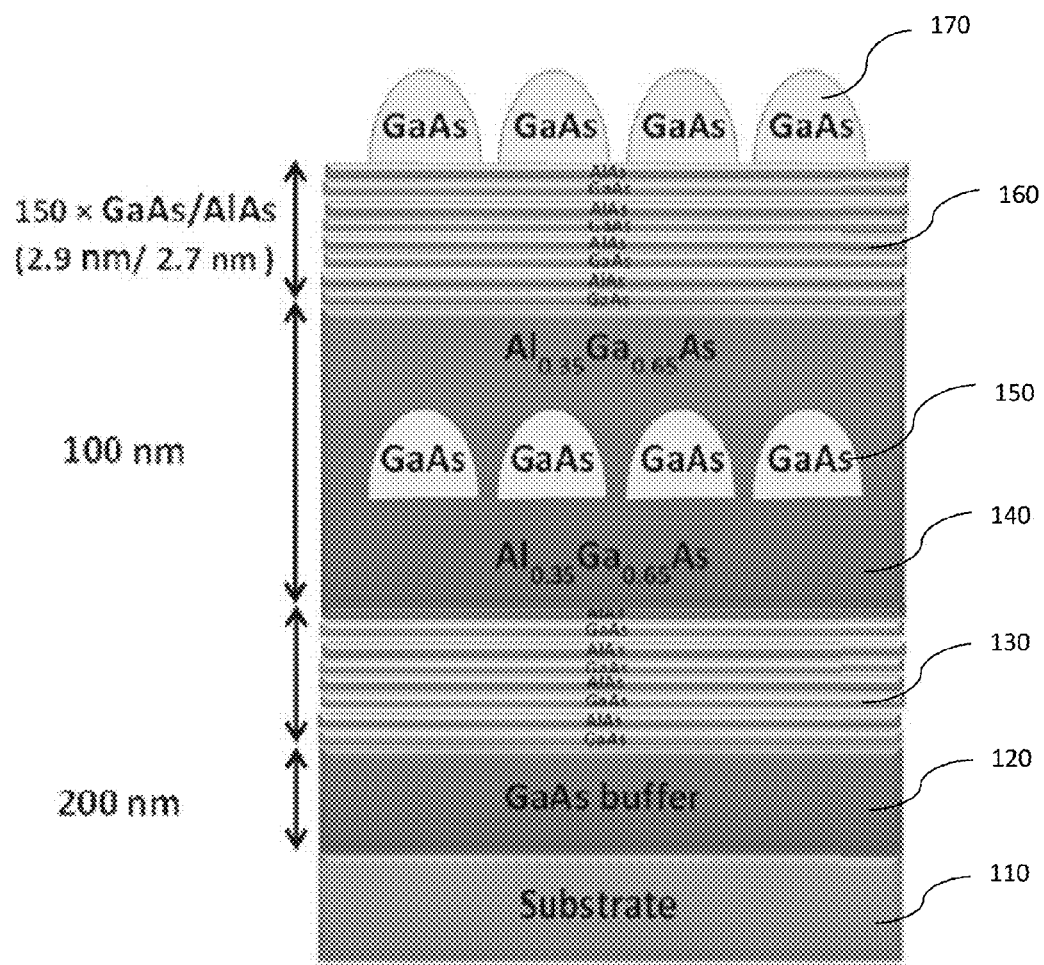
FIG. 1 is a schematic diagram illustrating an exemplary GaAs QDs semiconductor device.

FIG. 1 is a schematic diagram illustrating an exemplary GaAs QDs semiconductor device, consistent with the present disclosure. The semiconductor device comprises a substrate 110, a GaAs buffer 120, a GaAs/AlAs superlattice 130, an AlGaAs layer 140, in which GaAs QDs 150 are embedded, a GaAs/AlAs superlattice 160, and GaAs QDs 170.

Consistent with the present disclosure, one of ordinary skill in the art will recognize that the semiconductor device may also comprise a capping layer and that the layers may be repeated. For example, the capping layer may be the AlGaAs layer 150, and the layers 130 and 140 with embedded QDs may be repeated multiple times to grow more GaAs QDs.

The GaAs buffer layer 120 may have a thickness of about 200 nm. The GaAs/AlAs superlattices 130 and 160 may be 50-150 period superlattices. For a 150-period superlattice, GaAs may have a thickness of about 2.9 nm, while AlAs may have a thickness of about 2.7 nm.

The AlGaAs layer 140 may have a thickness of about 100 nm. GaAs QDs 150 are embedded in the AlGaAs layer 140. The GaAs QDs 150 and 170 have a high uniformity. The GaAs QDs 170 are tested for this high uniformity via an AFM image.

Figure 2A:
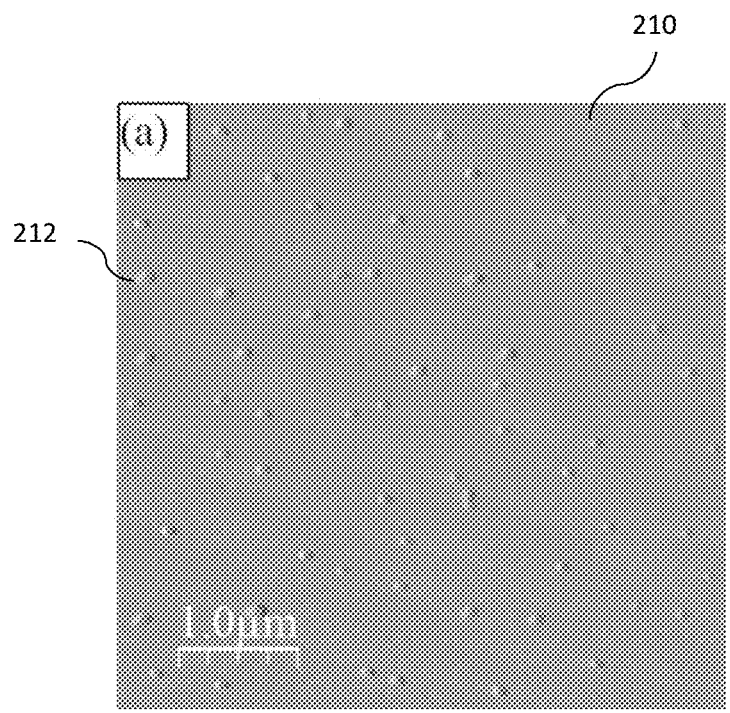
FIG. 2A is an Atomic Force Microscopy (AFM) image of surface morphologies for exemplary GaAs QDs from the surface at the growth temperature of 360° C. with the scan area of 5×5 μm.

FIG. 2A is an AFM image 210 of surface morphologies for the exemplary GaAs QDs 170 from the surface at the growth temperature of 360° C. with the scan area of 5×5 µm. As shown, the GaAs QDs 212 have a high uniformity and a round shape. In one example, the surface of the GaAs QDs 212 has a high uniformity (99±3 nm) and areal density of about $10^8$ $cm^{-2}$.

Figure 2B:
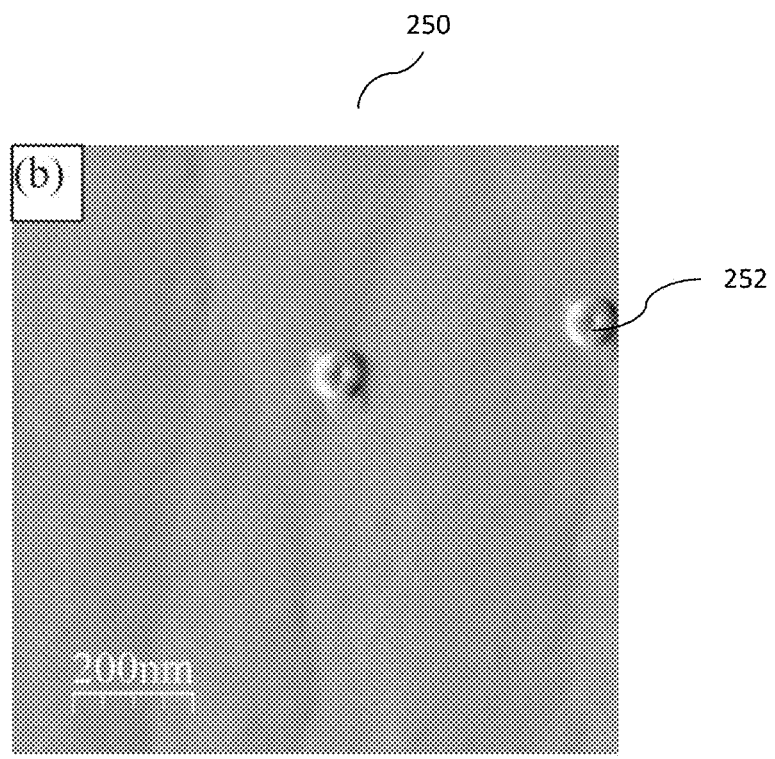
FIG. 2B is an AFM image of surface morphologies for exemplary GaAs QDs from the surface at the growth temperature of 360° C. with the scan area of 1×1 μm.

FIG. 2B is an AFM image 250 of surface morphologies for the exemplary GaAs QDs 170 from the surface at the growth temperature of 360° C. with the scan area of 1×1 µm. The AFM image 250 is a closer-up image of FIG. 2A and confirms that the GaAs QDs 170 have a high uniformity, as shown in the QDs 252.

Figure 3:
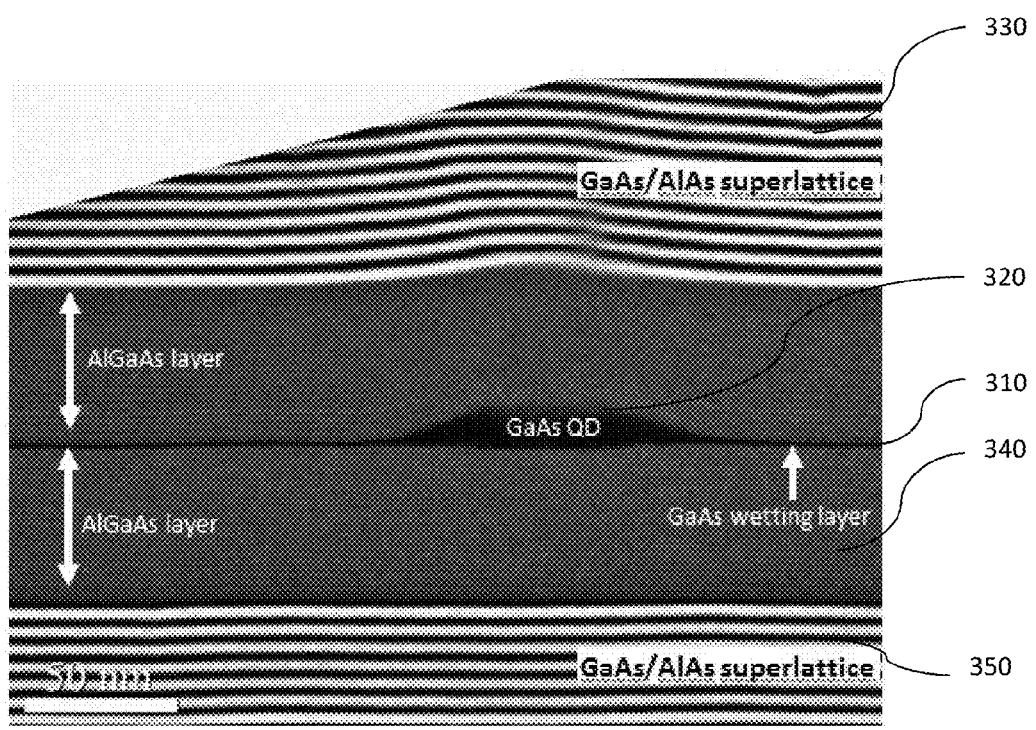
FIG. 3 is a Transmission Electron Microscopy (TEM) image of exemplary GaAs/AlGaAs QDs.

FIG. 3 is a TEM image of the exemplary GaAs/AlGaAs QDs 150 embedded in an AlGaAs layer 340, which itself is embedded between a GaAs/AlAs superlattice 330 and a GaAs/AlAs superlattice 350 (partially shown). The QD 320 is formed on the wetting layer 310 and embedded in the GaAs/AlAs superlattice 330. A continuous wetting layer 310 under the QDs is clearly observed.

Figure 4:
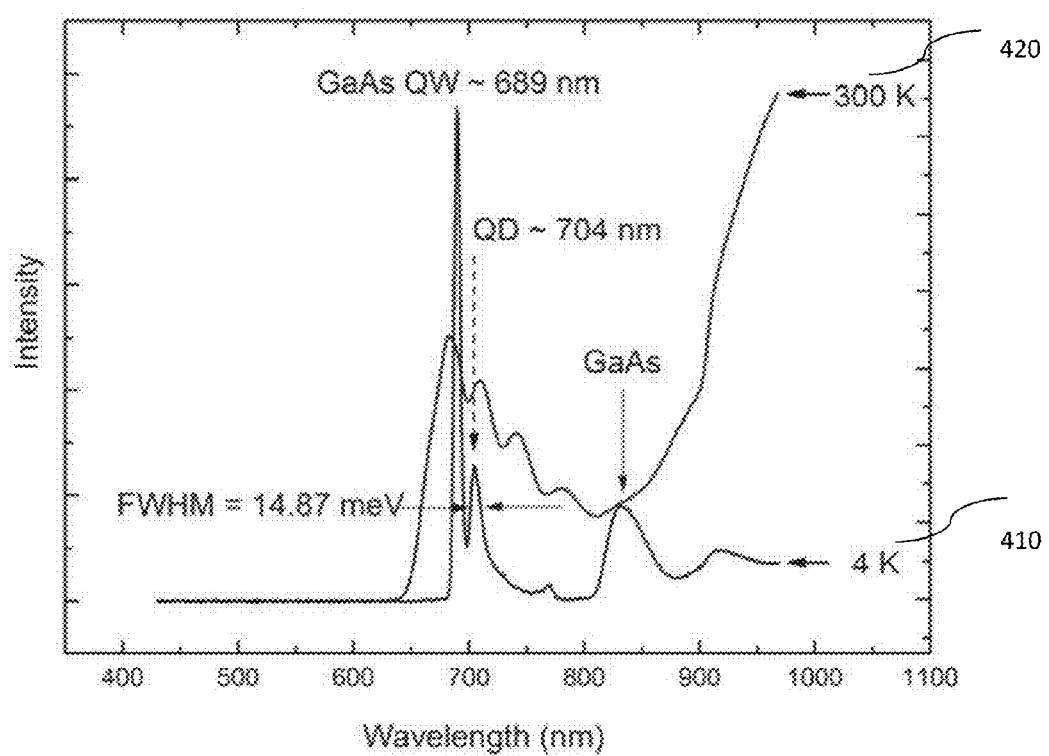
FIG. 4 illustrates PL spectra of exemplary GaAs/AlGaAs QDs coupled with GaAs wetting layer, measured at the temperatures of 4K and 300K.

FIG. 4 illustrates PL spectra of the exemplary GaAs/AlGaAs QDs 150 coupled with a GaAs wetting layer embedded in an AlGaAs layer within a GaAs/AlAs superlattice structure. The PL spectrum 410 is measured at the temperatures of 4K, while the PL spectrum 420 is measured at 300K, reflecting low-temperature and room temperature, respectively.

In FIG. 4, the very narrow PL emission, with a full width at half maximum (FWHM) of less than 20 meV (about 14.87 meV in this example), is observed from the QDs 150 at 4K (in the spectrum 410), which is centered at about 704 nm. This indicates high optical quality and excellent dot uniformity.

Despite the low areal number density of about $10^8$ $cm^{-2}$, the QD peak is now more intense than the GaAs peak from the GaAs buffer 120 in FIG. 1, which may be attributed to efficient transfer of carriers from the supper lattice to the wetting layer and from the wetting layer to the QDs. Note that an GaAs quantum well (QW) peak is centered at about 689 nm.

At a room temperature (300K), the PL spectrum 420 shows a series of sub-peaks, which may be attributed to different quantum confined dot states. In industrial applications, each sub-peak may be used to represent each distinct signal.

Figure 5:
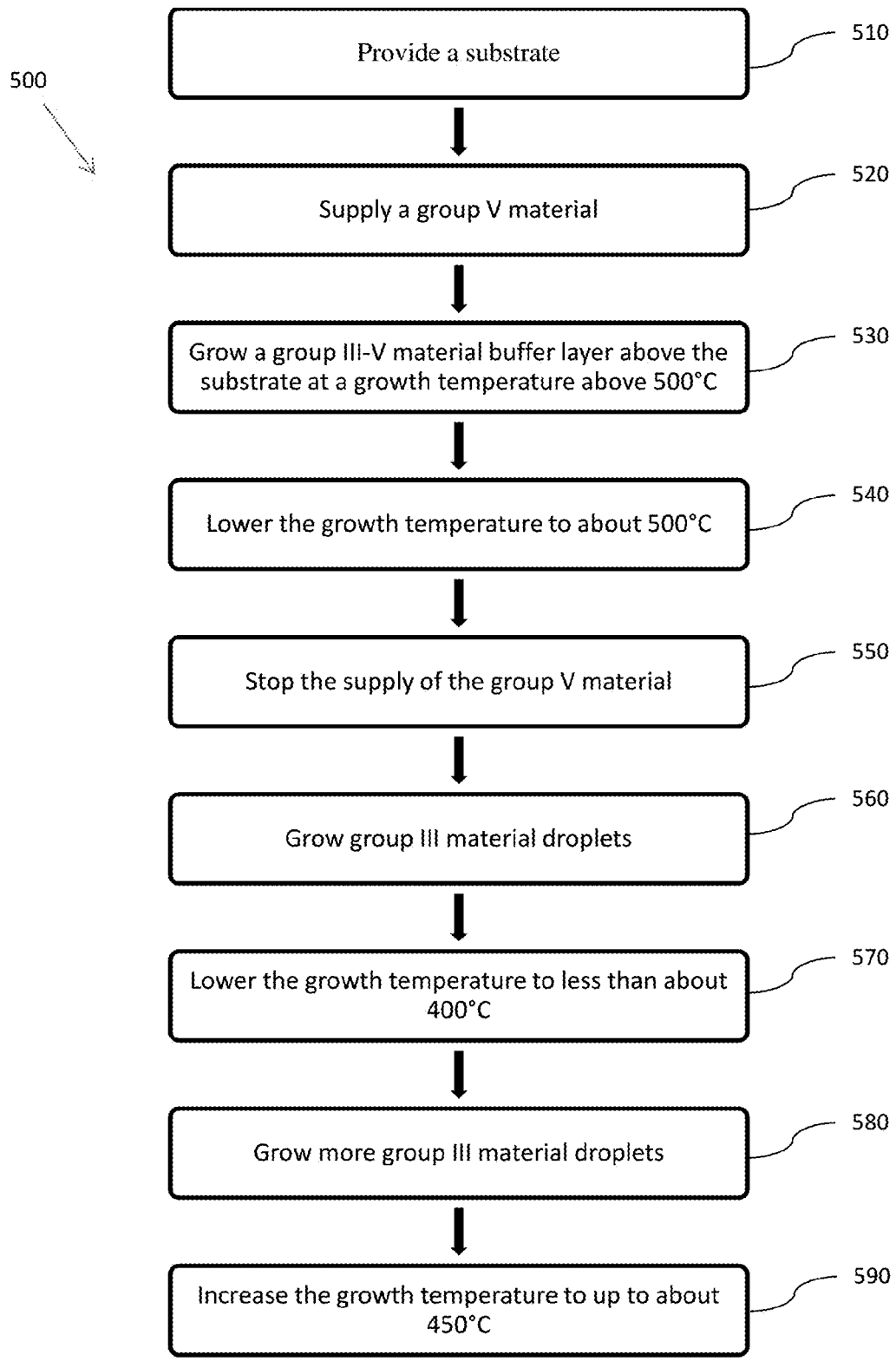
FIG. 5 illustrates an exemplary method of growing QDs on a semiconductor device.

Consistent with the present disclosure, FIG. 5 illustrates an exemplary method 500 of growing QDs on a semiconductor device. The method 500 comprises providing a substrate (step 510), supplying a group V material such as opening a group V material shutter (step 520), and growing a group III-V material buffer layer above the substrate at a growth temperature above 500° C. (e.g., 580° C.) (step 530). The method 500 also comprises lowering the growth temperature to about 500° C. (step 540), stopping the supply of a group V material such as closing the group V material shutter (step 550), and growing group III material droplets (step 560). The method 500 further comprises lowering the growth temperature to less than about 400° C. (e.g., a temperature between 200° C. and 400° C.) (step 570), growing more group III material droplets (step 580), and increasing the growth temperature to up to about 450° C. (e.g., a temperature between 360° C. and 450° C.) (step 590).

Consistent with the present disclosure, the group III material may be B, Al, Ga, In, or Tl. The group V material may be N, P, As, Sb, or Bi. The group III-V material may be, for example, GaAs, GaSb or AlGaAs.

In one embodiment, the group III material, group V material, and the group III-V material are Ga, As, and GaAs, respectively. The method 500 may further comprise one or more following steps at various stages: growing a GaAs/AlAs superlattice, growing an AlGaAs layer above the GaAs/AlAs superlattice, opening the As shutter, and crystallizing the Ga droplets into GaAs QDs. The method 500 may further comprise growing an AlGaAs capping layer. Some of these steps in the method 500 may be repeated to grow more QDs.

Figure 6A:
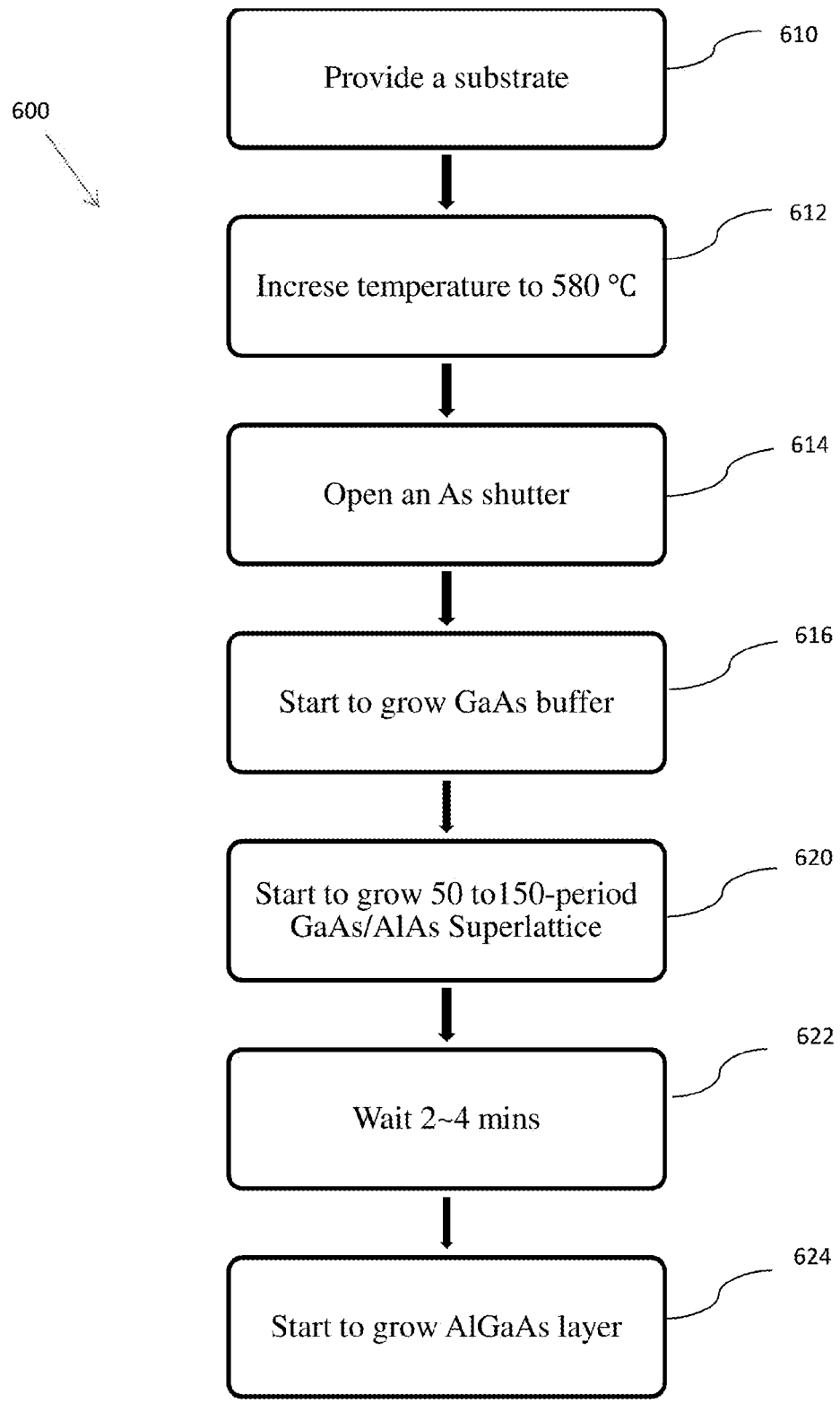
FIGS. 6A-6C illustrate another exemplary method of growing QDs on a semiconductor device.
Figure 6B:
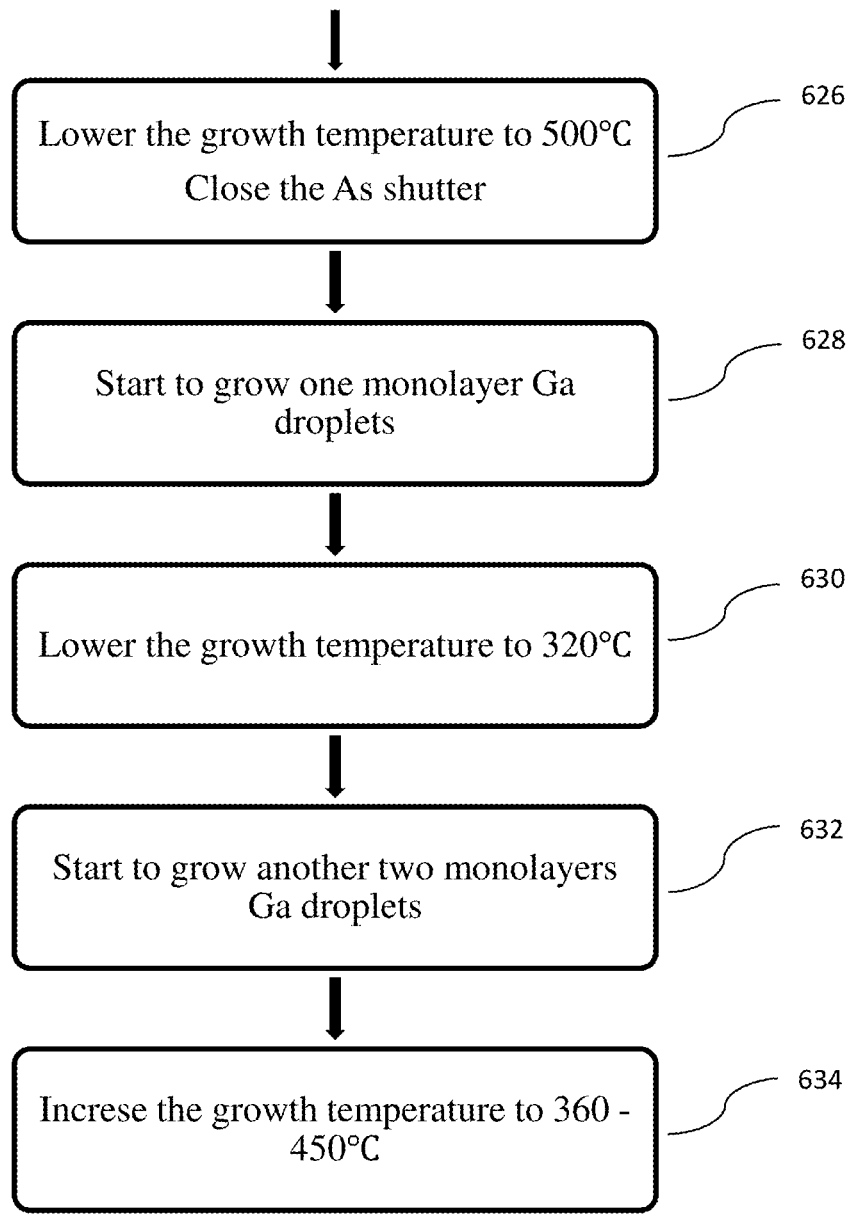
Figure 6C:
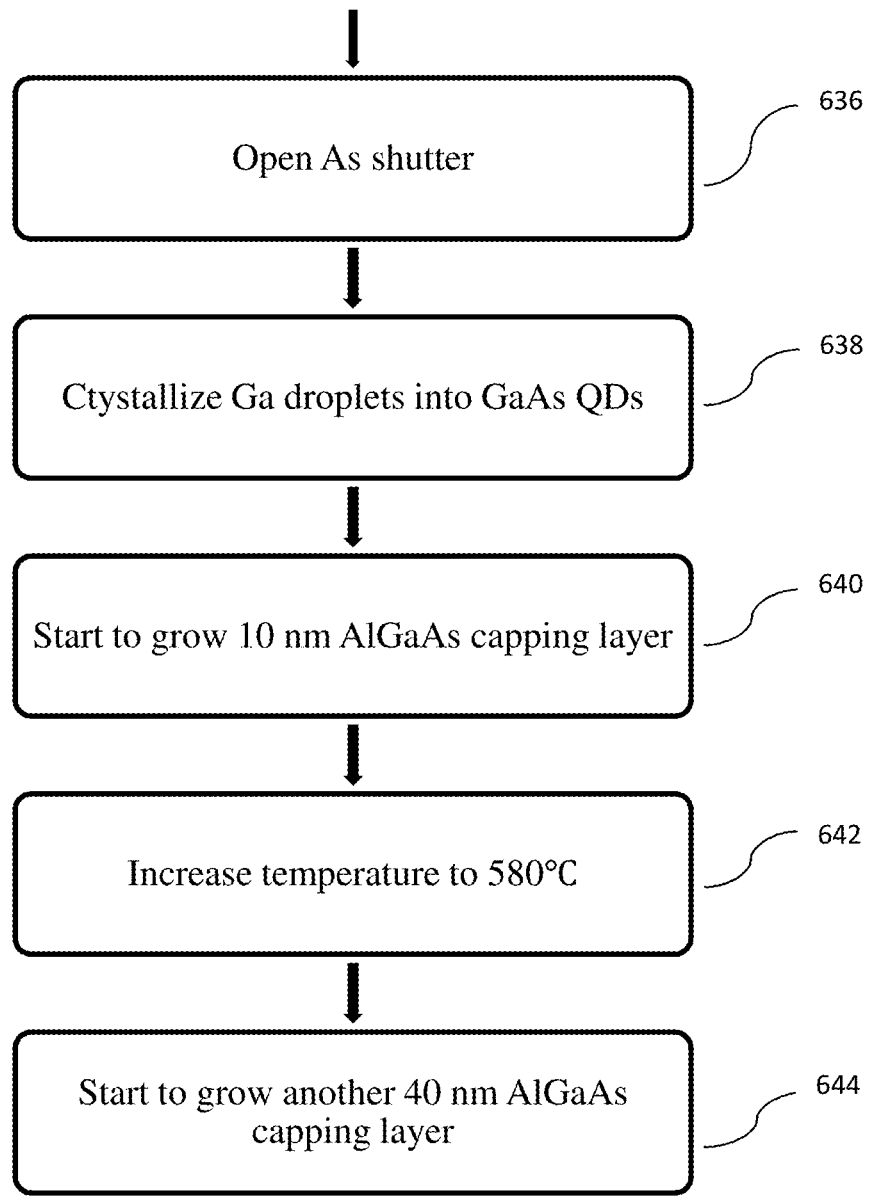

FIGS. 6A-6C illustrate another exemplary method 600 of growing QDs on a semiconductor device, consistent with the present disclosure. Here, droplet epitaxy of QDs involves two major stages, namely droplet formation and subsequent crystallization under As flux.

First, in step 610, a semi-insulating GaAs substrate is provided to grow QDs by molecular beam epitaxy. An optimized two-step growth method is used to prepare Ga droplets. In step 612, the temperature is increased to about 580° C. Then an As shutter is opened in step 614. Then, a GaAs buffer layer starts to grow in step 616.

After the growth of a 200 nm thick GaAs buffer layer at 580° C. on the surface of the GaAs wafer, it starts to grow a 150-period GaAs/AlAs superlattice above the GaAs buffer layer in step 620. The GaAs/AlAs superlattice may also be 50 to 150 period. After waiting for 2-4 minutes in step 622, it starts to grow an AlGaAs layer in step 624.

Next, in step 626, the substrate temperature is lowered to about 500° C. and the As shutter is fully closed to maintain a background pressure below $6\times10^{-10}$ Torr. C(4×4) surface reconstruction was clearly observed by reflection high-energy electron diffraction (RHEED). In step 628, the Ga droplets are then by first supplying 1 monolayer (ML) of Ga at a rate of 0.5 MLs$^{-1}$ without As flux.

Subsequently, in the second stage, the substrate temperature is lowered to about 320° C. in step 630, where 2 MLs of Ga were deposited at a rate of 0.5 MLs$^{-1}$ in step 632. Over the entire droplet formation process, the background pressure is kept below $6\times10^{-10}$ Torr. The crystallization process is carried out after the formation of the Ga droplets. At the crystallization step 634, the substrate temperature is increased to about 360° C.-450° C. The As shutter is opened in step 636. The Ga droplets are crystallized into GaAs QDs in step 638. During the crystallization process, the semiconductor is grown under the constant As$_4$ flux of about $4\times10^{-6}$ Torr for 10 min at about 360° C.-450° C.

The QDs are then capped by another 50 nm thick Al$_{0.35}$Ga$_{0.65}$As layer as follows. In step 640, it starts to grow 10 nm AlGaAs capping layer. Then the temperature is increased to about 580° C. in step 642, so that it starts to grow another 40 nm AlGaAs capping layer in step 644.

Some of the steps shown in FIGS. 6A-6C may be repeated to grow more layers of QDs. For example, followed by another 150-period superlattice, a second layer of QDs are formed on the surface of the semiconductor device under the same conditions as the buried dots in order to investigate their surface morphology using AFM, while TEM is used to evaluate the buried QDs, as shown in FIGS. 2 and 3. PL experiments are carried out at temperature from 4.2 to 300 K using multimode optical fibers to transmit 532 nm laser light to the semiconductor device and to collect the PL, which is analyzed by a spectrometer and electron-multiplying charge-coupled device (EMCCD), as shown in FIG. 4.

Consistent with another embodiment of the invention, another semiconductor device is disclosed herein, comprising a substrate and QDs, wherein a peak emission of the QDs has a FWHM of less than 8 meV when the semiconductor is measured at a temperature of 4.65K.

In addition, the QDs are doped by a group II or group IV material, such as Carbon. Incorporation of Carbon into the QDs enables direct access to all of the electron confined states, opening up new possibilities for the study of the physics of zero-dimensional systems.

The semiconductor device may further comprise a buffer layer wherein the buffer layer comprises a group III material and a group V material, including a group III-V material, and the QDs comprise a group III material and a group V material. For example, the buffer layer may be a GaAs buffer layer and the QDs comprise GaAs such as highly-uniform GaAs/AlGaAs QDs. The GaAs/AlGaAs QDs have very low dopant concentration when the substrate temperature is reduced to about 100° C.-200° C.

Figure 7:
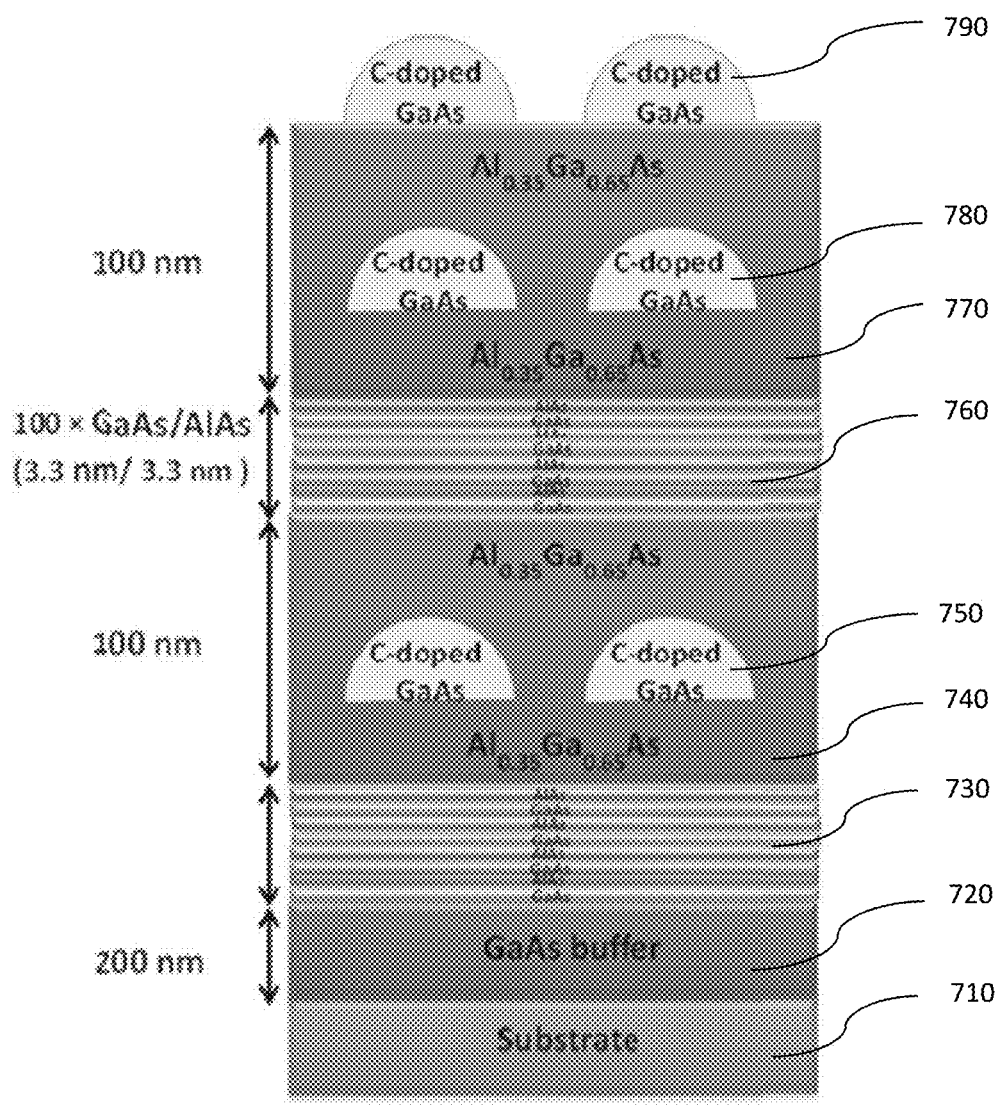
FIG. 7 is a schematic diagram illustrating an exemplary Carbon-doped GaAs QDs semiconductor device.

FIG. 7 is a schematic diagram illustrating an exemplary Carbon-doped GaAs QDs semiconductor device, consistent with the present disclosure. The semiconductor device comprises a substrate 710, a GaAs buffer 720, a GaAs/AlAs superlattice 730, an AlGaAs layer 740, in which Carbon-doped GaAs QDs 750 are embedded, a GaAs/AlAs superlattice 760, an AlGaAs layer 770, in which Carbon-doped GaAs QDs 780 are embedded, and Carbon-doped GaAs QDs 790.

Consistent with the present disclosure, one of ordinary skill in the art will recognize that the semiconductor device may also comprise a capping layer and that the layers may be repeated. For example, the capping layer may be the AlGaAs layer 750, and the layers 730 and 740 with embedded QDs may be repeated multiple times to grow more QDs.

The GaAs buffer layer 720 may have a thickness of about 200 nm. The GaAs/AlAs superlattices 730 and 760 may be 50-150 period superlattices. For a 150-period superlattice, GaAs and AlAs may each have a thickness of about 3.3 nm.

The AlGaAs layers 740 and 770 may have a thickness of about 100 nm. It contains embedded Carbon-doped GaAs QDs 750 and 780. The GaAs QDs 750, 780, and 790 have a high uniformity.

Consistent with the present disclosure, the density of an exemplary Carbon-doped GaAs/AlGaAs QDs may be in the range from about $5 \times 10^8$ cm$^{-2}$ to about $5 \times 10^9$ cm$^{-2}$ and the height may be in the range from about 1 nm to about 4 nm. Also consistent with the present disclosure, the ratio x between Al and Ga in the Al$_x$Ga$_{1-x}$As layer 740 is about 0.3-0.35.

Figure 8:
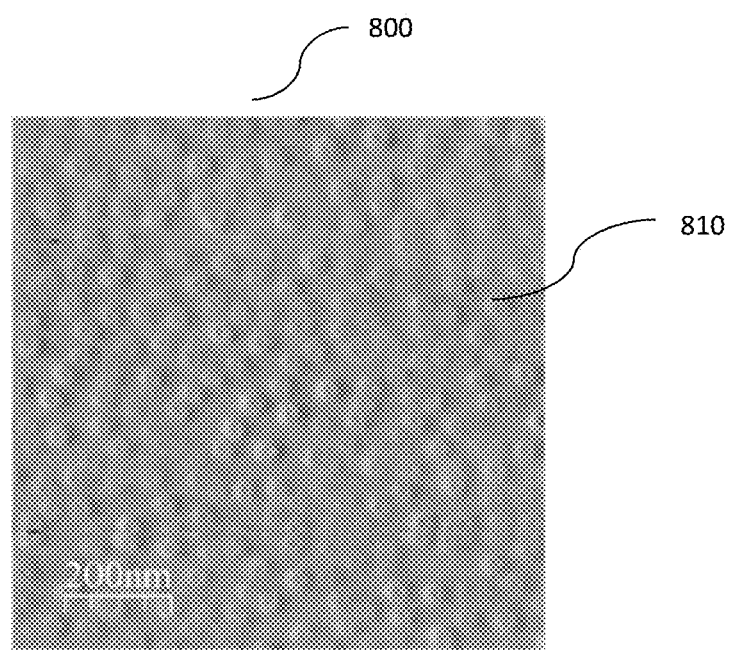
FIG. 8 is an AFM image of exemplary Carbon-doped GaAs QDs with the scan area of 1×1 μm.

FIG. 8 is an AFM image 800 of the exemplary Carbon-doped GaAs QDs 790 with the scan area of 1×1 μm. As shown, the Carbon-doped GaAs QDs 810 have a high uniformity and a round shape. In one example, the Carbon-doped GaAs QDs 810 have an average height of 2.25±0.5 nm and exhibit a ring-shape structure. The average base diameters of the Carbon-doped GaAs QDs are 50.3 nm. The areal density is $2.1 \times 10^{10}$ cm$^{-2}$.

Figure 9A:
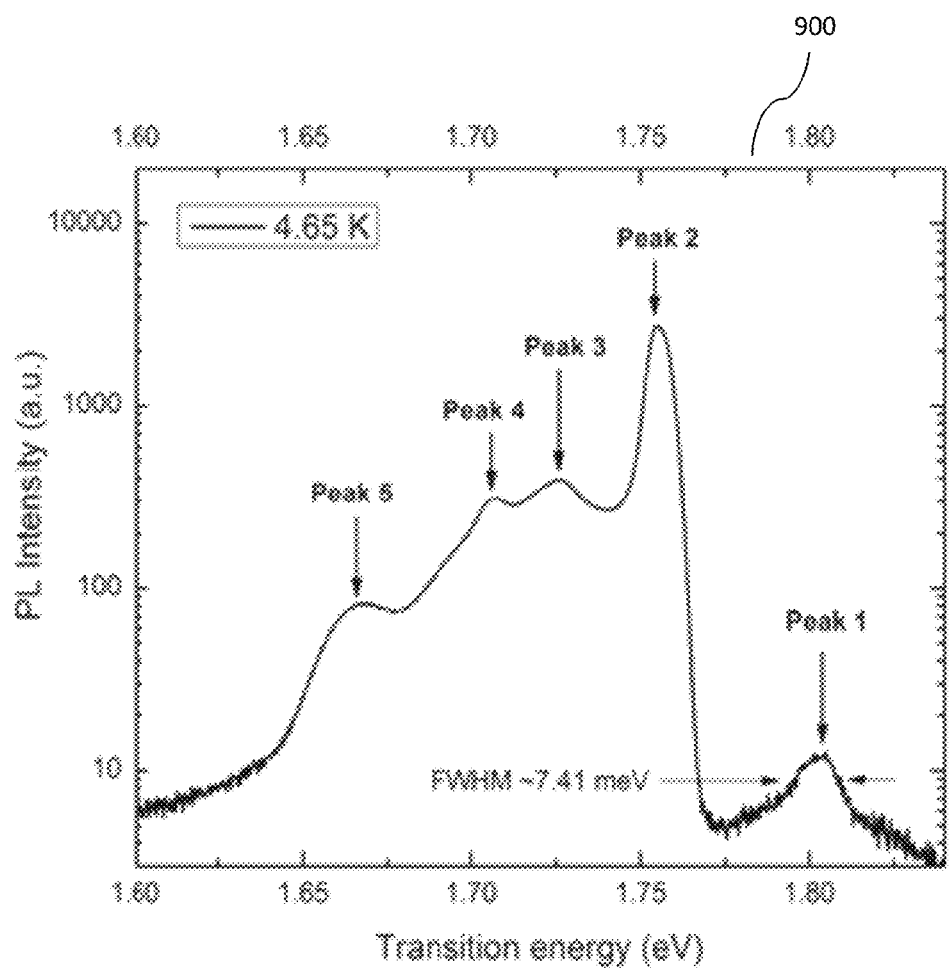
FIG. 9A illustrates a PL spectrum of exemplary Carbon-doped GaAs QDs, measured at the temperature of 4.65K.

FIG. 9A illustrates a PL spectrum 900 of the exemplary Carbon-doped GaAs QDs 750 and 780 in FIG. 7, measured at the temperature of 4.65K. As shown, the FWHM at Peak 1 which is from the recombination between confined electrons and confined heavy holes is less than 8 meV (around 7.41 meV in this example). In comparison with previous works, it is believed that this value is now the lowest in GaAs/AlGaAs QDs structures, leading to highly uniform GaAs QDs. More details about the recombination between confined electrons and impurity-bound holes will be discussed later.

Consistent with yet another embodiment of the invention, a semiconductor device is disclosed herein, comprising a substrate and QDs, wherein the PL spectrum of the QDs has more than two peaks in the red light range. As an example, the PL spectrum of the exemplary QDs 750 and 780 (see FIG. 7) has at least five peaks when the semiconductor device is measured at the temperature of 4.65K, as shown in FIG. 9A.

In industrial applications, each peak may be used to represent each distinct signal. Therefore, when a QD structure exhibits multiple peaks, it reduces the need for fabricating multiple QD structures for multiple signals, thus reducing producing costs.

The semiconductor device may further comprise a buffer layer wherein the buffer layer comprises a group III material and a group V material, including a group III-V material, and the QDs comprise a group III material and a group V material. For example, the buffer layer may be a GaAs buffer layer and the QDs comprise GaAs such as highly-uniform GaAs/AlGaAs QDs. In addition, the QDs are doped by a group II or IV material such as Carbon.

Referring back to FIG. 9A, the first red light has a peak (Peak 1) center wavelength in a range from about 685 nm to about 696 nm, corresponding to about 1.81 eV to about 1.78 eV in electron volt (eV). The second red light has a peak (Peak 2) center wavelength in the range from about 702 nm to 715 nm, corresponding to about 1.77 eV to about 1.73 eV. The third red light has a peak (Peak 3) center wavelength in a range from about 716 nm to about 725 nm, corresponding to about 1.72 eV to about 1.71 eV. The fourth red light has a peak (Peak 4) center wavelength in a range from about 726 nm to about 731 nm, corresponding to about 1.70 eV to about 1.69 eV. Finally, the fifth red light has a peak (Peak 5) center wavelength in a range from about 740 nm to about 750 nm, corresponding to about 1.68 eV to about 1.65 eV.

In one embodiment, each of the red light has a peak emission with a FWHM in a range from about 2 nm to about 8 nm, corresponding to about 7 meV to about 20 meV.

Figure 9B:
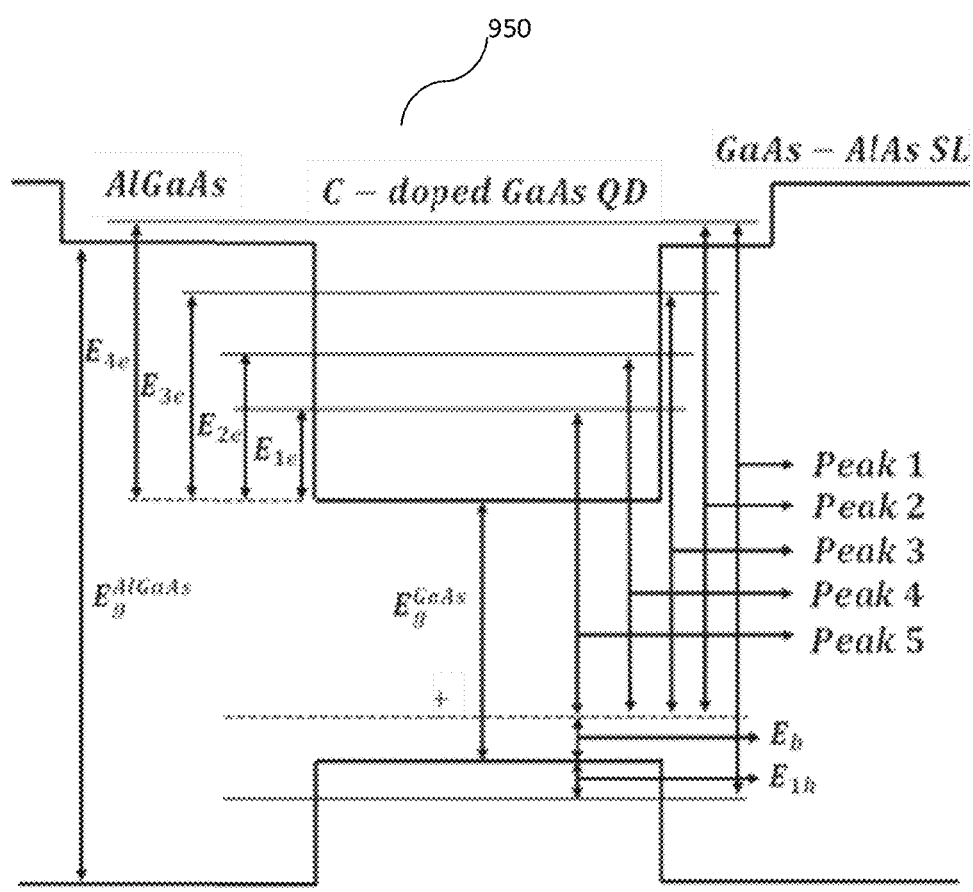
FIG. 9B is a schematic diagram illustrating transition energy between the conduction band and valence band in exemplary Carbon-doped GaAs/AlGaAs QDs.

FIG. 9B is a schematic diagram 950 illustrating transition energy between the conduction band and valence band in exemplary Carbon-doped GaAs/AlGaAs QDs embedded in an AlGaAs layer within a GaAs/AlAs superlattice structure. As shown here, there are four bound states, $E_{4e}$, $E_{3e}$, $E_{2e}$ and $E_{1e}$, for confined electrons in the conduction band and one bound state ($E_{1h}$) for heavy hole in this Carbon-doped QDs structure. The transition energy of Peak 1 (see FIG. 9A) is attributed to the interband transition between confined electrons (energy level at $E_{4e}$) and the heavy-hole state (energy level at $E_{1h}$).

In FIG. 9B, the bound state of $E_b$ is attributed to the carbon impurity, which producing acceptors in this QDs structure. Peak 2 is attributed to the transition between the confined electron (energy level at $E_{4e}$) and the carbon acceptors (energy level at $E_b$). Peak 3 is attributed to the transition between the confined electron (energy level at $E_{3e}$) and the carbon acceptors (energy level at $E_b$). Peak 4 is attributed to the transition between the confined electron (energy level at $E_{2e}$) and the carbon acceptors (energy level at $E_b$). Peak 5 is attributed to the transition between the confined electron (energy level at $E_{1e}$) and the carbon acceptors (energy level at $E_b$).

Figure 10:
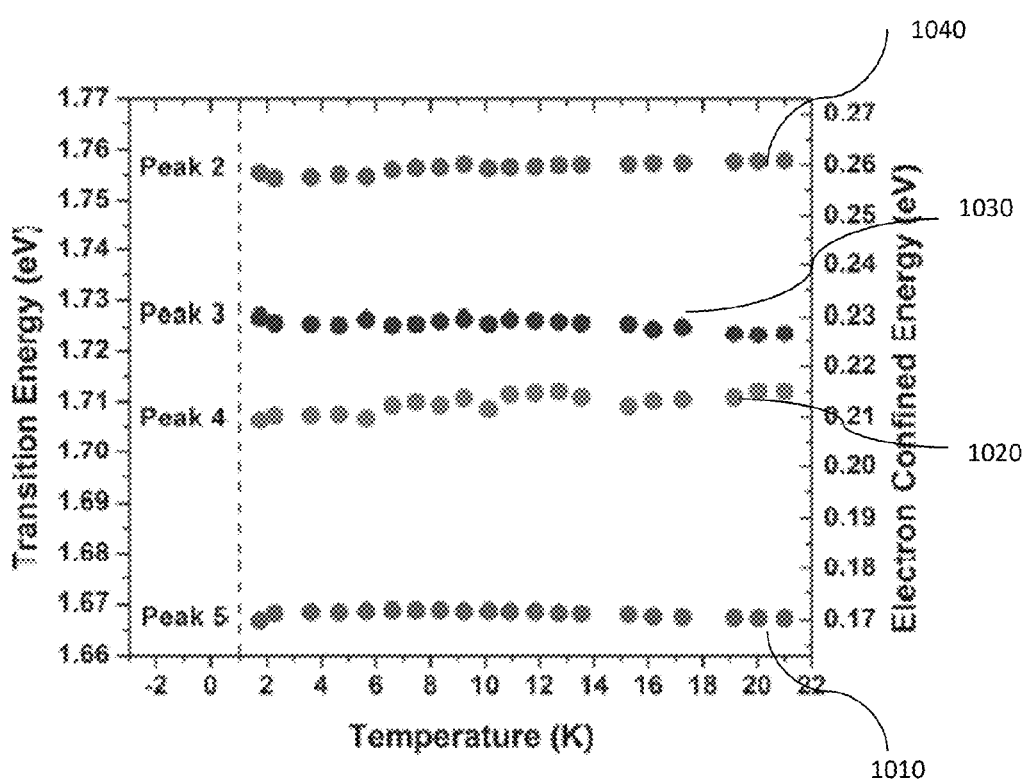
FIG. 10 illustrates the transition energy via electron confined energy in the conduction band of exemplary Carbon-doped GaAs/AlGaAs QDs structure at the temperature ranging from 1.74K to 21K.

FIG. 10 illustrates the transition energy via electron confined energy in the conduction band of an exemplary Carbon-doped GaAs/AlGaAs QDs structure at the temperature ranging from 1.74K to 21K. As shown, dots 1040, 1030, 1020, 1010 indicate the transition energy via the electron confined energy for Peaks 2 to 5, respectively, at the different temperatures ranging from 1.74 K to 21 K. It is clearly observed that the transition energy (or electron confined energy) almost maintain the same values when the temperature is increased, indicating high optical quality.

Figure 11:
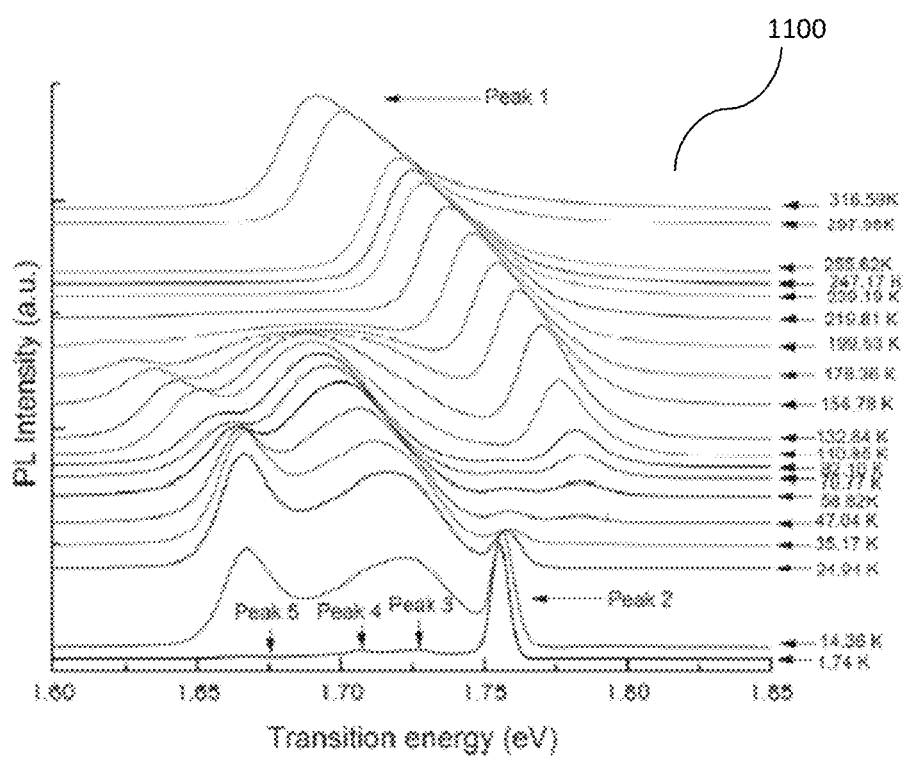
FIG. 11 illustrates temperature dependence of PL spectra of exemplary Carbon-doped GaAs QDs.

FIG. 11 illustrates temperature dependence of PL spectra of exemplary Carbon-doped GaAs QDs. Here, temperature dependence of PL spectra 1100 is observed. From the bottom up, each line represents temperature measured at various levels, corresponding to the lower to high temperatures as indicated.

Referring back to FIGS. 9A and 9B, the PL spectrum excited with 5.43 mW and radiative transitions are shown. It is estimated that the binding energy of neutral acceptor ($E_b$) in bulk GaAs is 24 meV. The energy for confined electrons and confined heavy-holes in different quantum well states are denoted by $E_{ne}$ and $E_{nh}$, respectively. (Here n is a quantum number that labels the states). It is assumed that Peak 1 gives the corresponding energy of 1.801 eV attributed to an n=4 electron recombining with n=1 heavy-hole. The prominent transitions involving n=1-4 electrons with neutral acceptors are labeled by Peak 2 (~1.754 eV), Peak 3 (~1.725 eV), Peak 4 (~1.705 eV) and Peak 5 (~1.667 eV).

With this information, it is estimated that the energy level of n=1 heavy-hole level in the valence-band well, namely $$E_{1h} = \text{Peak1} - \text{Peak2} - E_b = 23 \text{ meV} \quad (1)$$

The energy levels for n=1-4 electrons can be presented as $$E_{1e} = \text{Peak5} - E_g^{GaAs} + E_b = 172 \text{ meV}$$

$$E_{2e} = \text{Peak4} - E_g^{GaAs} + E_b = 210 \text{ meV}$$

$$E_{3e} = \text{Peak3} - E_g^{GaAs} + E_b = 229 \text{ meV}$$

$$E_{4e} = \text{Peak1} - E_g^{GaAs} - E_{1h} = 259 \text{ meV} \quad (2)$$

where $E_g^{GaAs}$ is the bandgap energy of bulk GaAs and equal to around 1.519 eV.

To prove this assumption, the electronic states of the GaAs QDs are calculated using an effective mass approach. The geometry of GaAs/AlGaAs QDs are estimated from AFM measurements. Here the energy level of n=1 heavy-hole state is directly taken form the PL experimental results (see Eq.1). Based on this structural analysis and a predetermined set of band parameters, energy levels of confined electrons in conduction-band well can be calculated.

The conduction and valence bands are centered around the Γ valley of GaAs and $Al_xGa_{1-x}As$. The Γ-valley electron effective mass $m^*_e$ is given in terms of band parameters:

$$\frac{m_0}{m^*_e} = (1 + 2F) + \frac{E_p\left(E_g + \frac{2\Delta_{so}}{3}\right)}{E_g(E_g + \Delta_{so})} \quad (3)$$

where $m_0$ is the free electron mass, F is Kane parameter, $\Delta_{so}$ is spin-orbit splitting parameter, $E_p$ is band parameter and $E_g$ is bandgap energy.

All of the parameters used in the calculation are compiled in Table 1 below.

TABLE 1

Band parameters using for calculation

| Parameter | GaAs | AlAs | $Al_{0.29}Ga_{0.71}As$ |
|---|---|---|---|
| $E_g$ (eV) | 1.519 | 3.099 | 1.9299 |
| $m_e^*$ ($m_0$) | 0.067 | 0.15 | 0.0916 |
| F | −1.94 | −0.48 | |
| $\Delta_{so}$ (eV) | 0.341 | 0.28 | |
| $E_p$ (eV) | 28.8 | 21.1 | |

For the conduction band offset $Q_c$ ($\Delta E_c = Q_c \Delta E_g$, where $\Delta E_c$ and $\Delta E_g$ are the conduction-band and band-gap discontinuities between GaAs and $Al_{0.29}Ga_{0.71}As$), the widely accepted value is around 0.62, leading to $$\Delta E_c = 0.62 \Delta E_g \quad (4)$$

With this information, it is calculated that the potential barrier-height of the conduction band is equal to 254.8 meV. The calculated n=1-4 confined-electron energy levels are $E_{1e}=172$ meV, $E_{2e}=205$ meV, $E_{3e}=234$ meV and $E_{4e}=259$ meV, which corresponds to the observed PL peak positions: Peak 1 (~1.801 eV), Peak 2 (~1.754 eV), Peak 3 (~1.729 eV) and Peak 4 (~1.705 eV) and Peak 5 (~1.667 eV). The n=4 confined electron state is 4.2 meV above the height of conduction-band is due to its localization at the miniband edge in GaAs/AlAs superlattice.

Therefore, four obvious confined-electron states are observed in low-temperature PL spectrum. Based on the structural results, the n=1-4 confined-electron states can be calculated using effective mass approach. The calculated state PL energy of GaAs/AlGaAs QDs is in excellent agreement with the observed energy.

Figure 12:
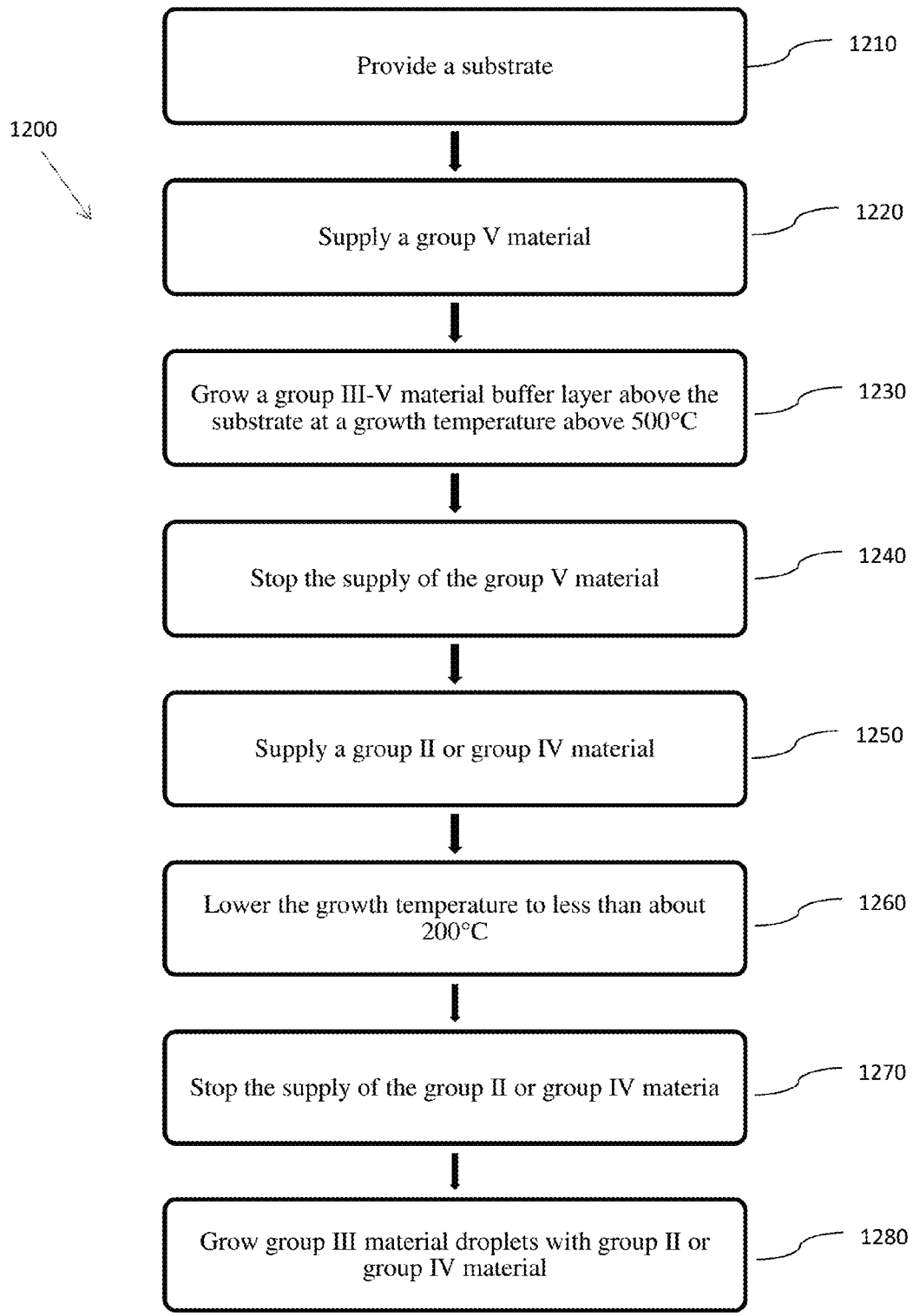
FIG. 12 illustrates another exemplary method of growing QDs on a semiconductor device.

Consistent with the present disclosure, FIG. 12 illustrates another exemplary method 1200 of growing QDs on a semiconductor device. The method 1200 comprises providing a substrate (step 1210), supplying a group V material such as opening a group V material shutter (step 1220), growing a group III-V material buffer layer above the substrate at a growth temperature above 500° C. (e.g., 580° C.) (step 1230), and stopping the supply of the group V material (step 1240).

The method 1200 also comprises supplying a group II or group IV material such as opening a group II or group IV material shutter (step 1250), lowering the growth temperature to less than about 200° C. (e.g., a temperature between 100° C. and 200° C.) (step 1260), stopping the supply of the group II or group IV material such as closing the group II or group IV material shutter (step 1270), and growing group III material droplets with group II or group IV material (step 1280).

The group III material may be B, Al, Ga, In, or Tl. The group V material may be N, P, As, Sb, or Bi. The group III-V material may be, for example, GaAs, GaSb or AlGaAs. The group II material may be, for example, Be, Mg, Ca, Sr, Ba, Ra, Zn, Cd, Hg, or Cn. The group IV material may be, for example, C, Si, Ge, Sn, Pb, or Fl.

In one embodiment, the group III material, group V material, the group III-V material, and the group II or group IV material are Ga, As, GaAs, and C, respectively. The method 1200 may further comprise one or more following steps at various stages: growing a GaAs/AlAs superlattice, growing an AlGaAs layer above the GaAs/AlAs superlattice, opening the As shutter, and crystallizing the Ga droplets into Carbon-doped GaAs QDs. The method 1200 may further comprise growing an AlGaAs capping layer. Some of these steps may be repeated to grow more QDs.

Figure 13A:
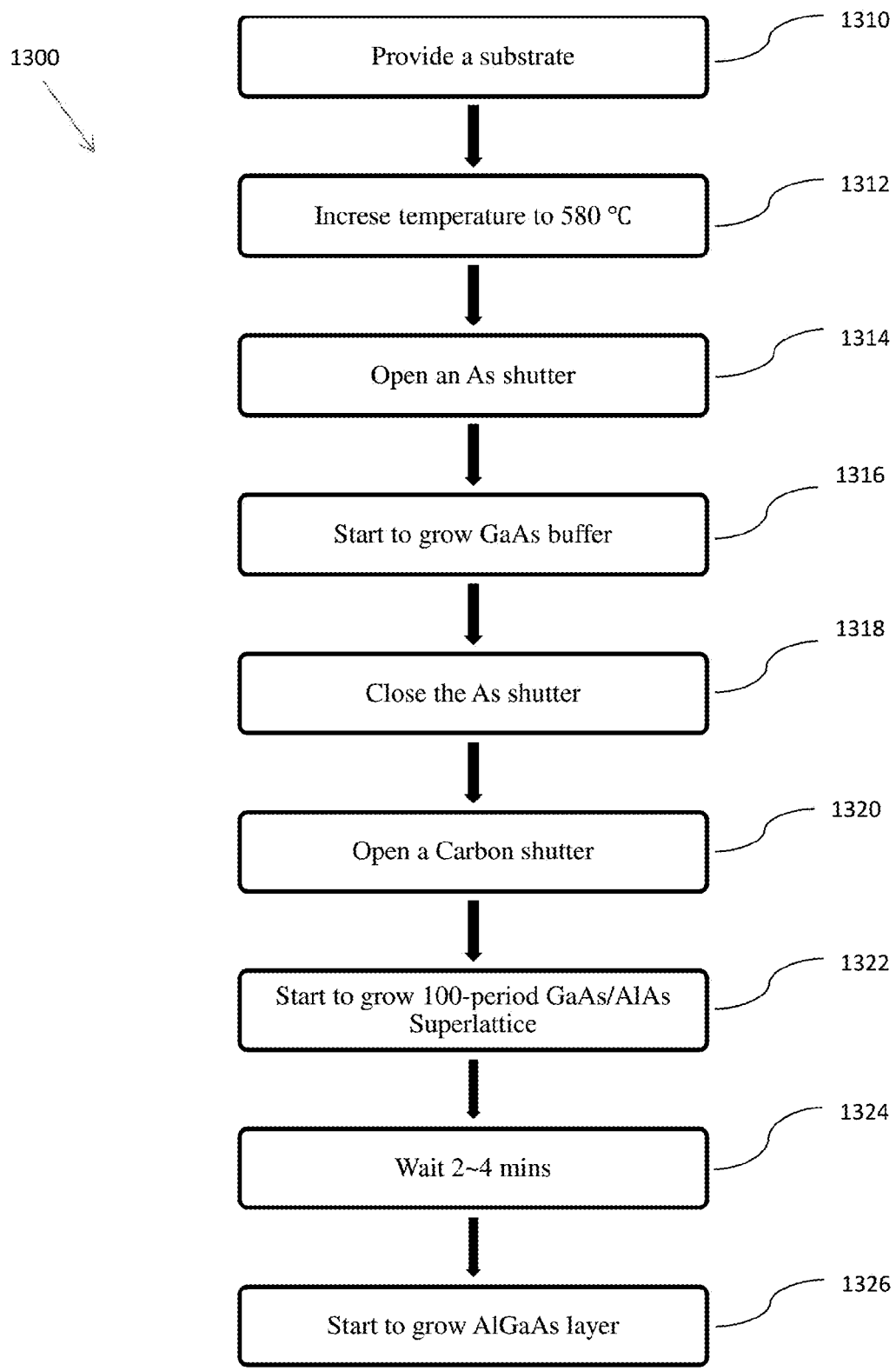
FIGS. 13A-13B illustrate yet another exemplary method of growing Carbon-doped QDs on a semiconductor device.
Figure 13B:
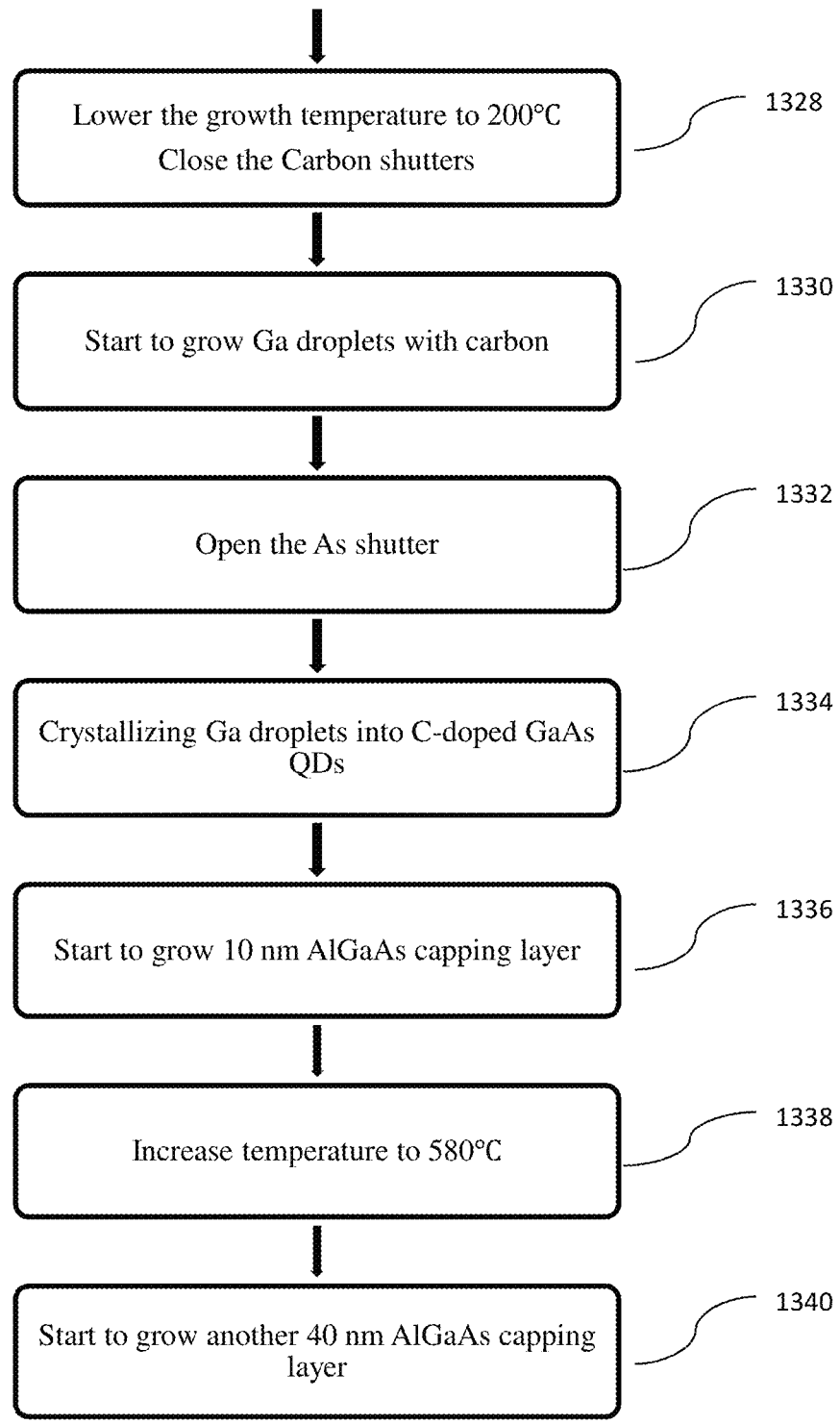

FIGS. 13A-13B illustrate an exemplary method 1300 of growing Carbon-doped QDs on a semiconductor device. First, in step 1310, a semi-insulating GaAs substrate is provided to grow QDs by MBE using DE technique. In step 1312, the temperature is increased to about 580° C. An As shutter is then opened in step 1314, and a GaAs buffer layer starts to grow in step 1316.

After the growth of a 200 nm thick GaAs buffer layer at about 580° C., the As shutter is fully closed in step 1318 to maintain a background pressure of $2 \times 10^{-10}$ Torr. C(4×4) surface reconstruction was clearly observed by RHEED. In step 1320, a Carbon shutter is opened.

Subsequently, a 100-period superlattice (SL) containing alternating layers of AlAs and GaAs (3.3 nm/3.3 nm) is formed in step 1322. After wait 2-4 minutes in step 1324, a 50 nm thick $Al_{0.35}Ga_{0.65}As$ is formed at about 580° C. in step 1326. During this step, the shutter for carbon source is fully opened.

Next, in step 1328, the substrate temperature is lowered to about 100° C.-200° C. and the Carbon shutter is immediately closed. The Ga droplets are formed by supplying 3 MLs of Ga at a rate of 0.5 MLs$^{-1}$ without As flux in step 1330. Over the entire droplet formation process, the background pressure was kept below $2 \times 10^{-9}$ Torr.

In step 1332, the As shutter is opened. The crystallization process is carried out under the constant As$_4$ flux of $4 \times 10^{-6}$ Torr for 10 min at the growth temperature of about 100° C.-200° C., and the Ga droplets are crystallized into Carbon-doped GaAs QDs in step 1334. The carbon-doped GaAs QDs then are capped by a 10 nm thick Al$_{0.35}$Ga$_{0.65}$As at the same growth temperature in step 1336. The substrate temperature is then increased to about 580° C. in step 1338. Another 40 nm thick Al$_{0.35}$Ga$_{0.65}$As capping layer is formed in step 1340.

Some of the steps shown in FIGS. 13A and 13B may be repeated to grow more layers of QDs. For example, a third layer of carbon-doped GaAs QDs (see FIG. 7) is formed on the surface of the semiconductor device under the same conditions as the buried dots in order to investigate their surface morphology using AFM, as shown in FIG. 8. PL experiments are carried out at temperature from 4.2 to 300 K using multimode optical fibers to transmit 532 nm laser light to the semiconductor device and to collect the PL, which was analyzed by a spectrometer and EMCCD, as shown in FIGS. 9A, 9B, 10, and 11.

The QDs and method of growing them disclosed above have many industrial applications, including, but not limited to, optical applications, quantum computing, and biological and chemical applications.

Regarding optical applications, consistent with the present disclosure, the QDs may be used in applications where precise control of colored light is important. As one example, a thin filter made of QDs may be fitted on top of a fluorescent or LED lamp and convert its light from a blueish color to a redder shade similar to the light produced by old-fashioned incandescent lamps. The QDs may also be used instead of pigments and dyes. Embedded in other materials, they absorb incoming light of one color and produce light of an entirely different color. They are also brighter and more controllable than organic dyes made from synthetic chemicals.

Consistent with the present disclosure, the QDs may also be used in the development of more efficient solar cells. In a traditional solar cell, photons of sunlight knock electrons out of a semiconductor into a circuit, making useful electric power, but the efficiency of the process is quite low. The QDs produce more electrons (or holes) for each photon that strikes them, potentially offering a boost in higher efficiency than conventional semiconductors.

Also consistent with the present disclosure, the QDs may also be used to make smaller and more efficient charge-coupled devices (CCDs) for applications where conventional devices are too big and clumsy. CCDs are the image-detecting chips in such things as digital cameras and webcams, work in a similar way to solar cells, by converting incoming light into patterns of electrical signals.

Also consistent with the present disclosure, the QDs may be used in computer screens and displays for several advantages. First, in a typical liquid crystal display screen (LCD), the image is made by tiny combinations of red, blue, and green crystals that are illuminated from behind by a very bright backlight. The QDs can be tuned to give off light of any color, so the colors of a QD display are likely to be much more realistic. Second, the QDs produce light themselves so they need no backlight, making them much more energy efficient, which is an important consideration in portable devices such as cellphones where a long battery life is desired. Third, the QDs are much smaller than liquid crystals so they could give a much higher-resolution image.

Regarding quantum computing, consistent with the present disclosure, the QDs may be used in optical computers, making them possible to store and transmit information with light instead of electrons. Optical computers may use the QDs in the similar way that electronic computers use transistors (electronic switching devices), as the basic components in memory chips and logic gates.

In a quantum computer, bits (binary digits) are stored not by transistors but by individual atoms, ions, electrons, or photons linked together (i.e., "entangled") and acting as quantum bits called qubits. These quantum-scale "switches" can store multiple values simultaneously and work on different problems in parallel. Individual atoms and so on are hard to control in this way, but the QDs are easier to work with.

Regarding biological and chemical applications, consistent with the present disclosure, the QDs may be designed so they accumulate in particular parts of the body and then deliver anti-cancer drugs bound to them. Their big advantage is that they can be targeted at single organs, such as the liver, much more precisely than conventional drugs, so reducing the unpleasant side effects that are characteristic of untargeted, traditional chemotherapy.

Further consistent with the present disclosure, the QDs may also be used in place of organic dyes in biological research. For example, they can be used like nanoscopic light bulbs to light up and color specific cells that need to be studied under a microscope. They may be tested as sensors for chemical and biological warfare agents such as anthrax. Unlike organic dyes, which operate over a limited range of colors and degrade relatively quickly, QD dyes are very bright, can be made to produce any color of visible light, and last longer.

Finally, one of ordinary skill in the art will now recognize that, consistent with embodiments of the present invention, QDs and methods of growing such of many types and natures are contemplated.

For example, while the embodiments described in this disclosure use Ga as a group III material. Consistent with the present disclosure, one of ordinary skill in the art will recognize that other group III materials, such as, Al, In, or TI, may be used. Similarly, while the embodiments described in this disclosure use As as a group V material. Consistent with the present disclosure, one of ordinary skill in the art will recognize that other group V materials, such as, N, P, Sb, or Bi, may be used.

Likewise, while the embodiments described in this disclosure use GaAs as a group III-V material. Consistent with the present disclosure, one of ordinary skill in the art will recognize that other group III-V materials, or various combinations thereof, such as GaSb or AlGaAs, may be used.

Moreover, while the embodiments described in this disclosure use Carbon as a group II or group IV material. Consistent with the present disclosure, one of ordinary skill in the art will recognize that other group II or group IV materials, such as, Be, Mg, Ca, Sr, Ba, Ra, Zn, Cd, Hg, Cn, Si, Ge, Sn, Pb, or Fl, may be used.

As another example, the QDs described above have a ring shape. Consistent with the present disclosure, one of ordinary skill in the art will recognize that the QDs may also have other shapes such as double ring and hemisphere. In addition, the present disclosure describes various temperatures, such as 200° C., 400° C., 450° C., and 500° C., in the methods of growing QDs. Consistent with the present disclosure, one of ordinary skill in the art will recognize that these temperatures need not be the exact and other approximate temperatures may also be used.

As yet another example, the present disclosure describes thickness of various layers including Gas buffer and AlGaAs layers in various embodiments. Consistent with the present disclosure, one of ordinary skill in the art will recognize that other thicknesses may also be used.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
    a substrate; and
    quantum dots formed on the substrate without a quantum well,
    wherein a peak emission of the quantum dots has a FWHM of less than 20 meV when the semiconductor is measured at a temperature of 4 Kelvin.

2. The semiconductor device of claim 1, further comprising a buffer layer wherein:
    the buffer layer comprises a group III material and a group V material, and
    the quantum dots comprise a group III material and a group V material.

3. The semiconductor device of claim 2, wherein the buffer layer is a GaAs buffer layer and the quantum dots comprise GaAs.

4. The semiconductor device of claim 3, wherein the quantum dots are doped by a group II or group IV material.

5. The semiconductor device of claim 4, wherein the quantum dots are Carbon-doped.

6. The semiconductor device of claim 5, wherein the peak emission of the quantum dots has a FWHM of less than 8 meV when the semiconductor device is measured at a temperature of 4.65 Kelvin.

7. The semiconductor device of claim 1, wherein the quantum dots and the substrate are lattice matched to form strain free quantum dots.

8. The semiconductor device of claim 1, wherein ground state emission occurs at a wavelength shorter than 1000 nm at a temperature of 300 Kelvin.

9. A semiconductor device, comprising:
    a substrate; and
    quantum dots;
    wherein the photoluminescence spectrum of the quantum dots has more than two peaks in the red light range and each peak emission of the quantum dots has a FWHM of less than 20 meV.

10. The semiconductor device of claim 9, wherein the photoluminescence spectrum of the quantum dots has at least five peaks when the semiconductor device is measured at a temperature of 4.65 Kelvin.

11. The semiconductor device of claim 10, further comprising a buffer layer wherein:
    the buffer layer comprises a group III material and a group V material, and
    the quantum dots comprise a group III material and a group V material.

12. The semiconductor device of claim 11, wherein the buffer layer is a GaAs buffer layer and the quantum dots comprise GaAs.

13. The semiconductor device of claim 12, wherein the quantum dots are doped by a group II or group IV material.

14. The semiconductor device of claim 13, wherein the quantum dots are Carbon-doped.

15. The semiconductor device of claim 9, wherein the quantum dots are formed on the substrate without a quantum well.

16. The semiconductor device of claim 9, wherein the quantum dots and the substrate are lattice matched to form strain free quantum dots.

17. A method for growing quantum dots on a semiconductor device, comprising:
    (a) providing a substrate;
    (b) supplying a group V material;
    (c) growing a group III-V material buffer layer above the substrate at a growth temperature above 500° C.;
    (d) lowering the growth temperature to about 500° C.;
    (e) stopping the supply of the group V material;
    (f) growing group III material droplets;
    (g) lowering the growth temperature to less than about 400° C.;
    (h) growing more group III material droplets; and
    (i) increasing the growth temperature to up to about 450° C.

18. The method of claim 17, wherein:
    the group V material in steps (b) and (e) is As;
    the group III-V material in step (c) is GaAs; and
    the group III material in steps (f) and (h) is Ga.

19. The method of claim 18, further comprising:
    growing a GaAs and AlAs superlattice; and
    growing an AlGaAs layer above the GaAs and AlAs superlattice.

20. The method of claim 19, further comprising:
    opening the As shutter; and
    crystallizing the Ga droplets into GaAs quantum dots.

21. The method of claim 20, further comprising growing an AlGaAs capping layer.

22. A method for growing quantum dots on a semiconductor device, comprising:
    (a) providing a substrate;
    (b) supplying a group V material;
    (c) growing a group III-V material buffer layer above the substrate at a growth temperature above 500° C.;
    (d) stopping the supply of the group V material;
    (e) supplying a group II or group IV material;
    (f) lowering the growth temperature to less than about 200° C.;
    (g) stopping the supply of the group II or group IV material; and
    (h) growing group III material droplets with the group II or group IV material.

23. The method of claim 22, wherein:
    the group V material in steps (b) and (d) is As;
    the group III-V material in step (c) is GaAs;
    the group III material in step (h) is Ga; and
    the group II or group IV material in steps (e), (g), and (h) is Carbon.

24. The method of claim 23, further comprising:
    growing a GaAs and AlAs superlattice; and
    growing AlGaAs layer above the GaAs and AlAs superlattice.

25. The method of claim 24, further comprising:
    opening the As shutter; and
    crystallizing the Ga droplets into Carbon-doped GaAs quantum dots.

26. The method of claim 25, further comprising growing an AlGaAs capping layer.

* * * * *